United States Patent
Wakabayashi et al.

(10) Patent No.: US 10,312,814 B2
(45) Date of Patent: Jun. 4, 2019

(54) POWER SOURCE APPARATUS SUPPLYING POWER TO LOAD

(71) Applicant: Funai Electric Co., Ltd., Osaka (JP)

(72) Inventors: Naoyuki Wakabayashi, Osaka (JP); Takafumi Nishikawa, Osaka (JP); Koji Ohira, Hirakata (JP)

(73) Assignee: Funai Electric Co., LTD., Osaka (JP)

( * ) Notice: Subject to any disclaimer, the term of this patent is extended or adjusted under 35 U.S.C. 154(b) by 0 days.

(21) Appl. No.: 15/802,862

(22) Filed: Nov. 3, 2017

(65) Prior Publication Data

US 2018/0131280 A1    May 10, 2018

(30) Foreign Application Priority Data

Nov. 4, 2016   (JP) ................ 2016-216548

(51) Int. Cl.
  *H03F 3/217*    (2006.01)
  *H02M 3/156*    (2006.01)
  *H02M 3/24*    (2006.01)

(52) U.S. Cl.
  CPC ............ *H02M 3/24* (2013.01); *H03F 3/2176* (2013.01); *H02M 3/156* (2013.01); *Y02B 70/1491* (2013.01)

(58) Field of Classification Search
  CPC ....... H02M 3/24; H02M 3/156; H03F 3/2176; H02J 50/12; Y02B 70/1416; Y02B 70/1425; Y02B 70/1433; Y02B 70/1491
  See application file for complete search history.

(56) References Cited

U.S. PATENT DOCUMENTS

| | | | |
|---|---|---|---|
| 5,179,511 A * | 1/1993 | Troyk | H02M 3/156 323/222 |
| 6,222,355 B1 * | 4/2001 | Ohshima | H03K 17/0822 323/282 |
| 7,995,318 B1 | 8/2011 | Feller | |
| 8,907,723 B2 * | 12/2014 | Onizuka | H03F 3/2176 330/207 A |
| 2009/0201004 A1 | 8/2009 | Honda | |
| 2013/0043951 A1 * | 2/2013 | Irish | H02J 50/12 330/285 |
| 2014/0125410 A1 * | 5/2014 | Pamarti | H03F 3/2176 330/149 |

FOREIGN PATENT DOCUMENTS

| JP | H06-243985 A | 9/1994 |
|---|---|---|
| JP | 2008-252214 A | 10/2008 |

OTHER PUBLICATIONS

Extended European Search Report issued in corresponding European Application No. 17199814.9 dated Mar. 21, 2018 (7 pages).

* cited by examiner

*Primary Examiner* — Adolf D Berhane
*Assistant Examiner* — Jye-June Lee
(74) *Attorney, Agent, or Firm* — Osha Liang LLP

(57) ABSTRACT

A power source apparatus for supplying power to a load includes a switch and a controller. The controller detects voltage applied to the switch. The controller further switches a state of the switch from OFF to ON when the detected voltage is equal to or smaller than a predetermined threshold value.

14 Claims, 22 Drawing Sheets

POWER SOURCE APPARATUS SUPPLYING POWER TO LOAD

BACKGROUND

Technical Field

The present invention relates to a power source apparatus for supplying power to a load.

Related Art

A class E amplifier (ZVS: Zero Voltage Switching) is known as a power source apparatus for supplying power to a load. In class E amplifiers, the voltage between terminals of the switching element is 0 (zero), and by the switching element switching from off to on at the timing when a differentiation value of the voltage (or in other words, peak of the voltage) is 0 (zero), it is possible to operate at high efficiency because switching loss can be kept small.

In such a class E amplifier, efficiency of the class E amplifier may be reduced due to the operating point of the class E amplifier changing based on fluctuation of the load and the like Because of this, in the class E amplifier in patent literature 1, the operating point of the class E amplifier is adjusted by mechanically switching the connected state of a plurality of capacitors connected in parallel between, for example, the switching element and the load, based on the fluctuation of the load or the like.

PATENT LITERATURE

[Patent Literature 1] Japanese Unexamined Patent Application Publication No. H6-243985

SUMMARY

However, in a method for mechanically switching the connected state of the plurality of capacitors, it may be difficult to accurately adjust the operating point of the class E amplifier, and the efficiency of the class E amplifier may not be sufficiently improved.

One or more embodiments of the present invention provide a power source apparatus that sufficiently improves efficiency.

A power source apparatus according to one or more embodiments of the present invention is a power source apparatus for supplying power to a load, provided with a switching portion, a detection unit for detecting voltage of the switching portion, a drive unit for controlling the switching portion, and a control unit for switching the switching portion from OFF to ON based on the voltage being at a predetermined threshold value or lower.

Accordingly, the control unit switches the switching portion from OFF to ON based on the voltage being at a predetermined threshold value or lower. By this, for example, even when the operation point of the power source apparatus changes due to variation or the like in the load (for example, when the minimum point of the voltage changes), by appropriately changing the timing when the switching portion switches from OFF to ON, switching loss can be sufficiently suppressed, and the efficiency of the power source apparatus can be sufficiently improved.

For example, in the power source apparatus according to one or more embodiments of the present invention, the control unit may be configured to switch the switching element from OFF to ON by adjusting the duty ratio of the switching portion.

Accordingly, because the duty ratio of the switching portion can be continuously adjusted, it is possible to accurately adjust the timing when the switching element switches from OFF to ON.

For example, in the power source apparatus according to one or more embodiments of the present invention, it may be configured so that the power source apparatus is further provided with a differentiation detection unit for detecting a differentiation value of the voltage based on the voltage, and the control unit controls the duty ratio of the switching portion based on the differentiation value.

For example, in the power source apparatus according to one or more embodiments of the present invention, it may be configured so that the control unit makes the duty ratio of the switching portion larger when the differentiation value is a positive value based on the switching portion being switched from OFF to ON, and makes the duty ratio of the switching portion smaller when the differentiation value is a negative value based on the switching portion being switched from OFF to ON.

Accordingly, the duty ratio of the switching portion is reduced or increased based on the positive/negative symbol of the differentiation value at the timing when the switching portion switches from OFF to ON. By this, it is possible to switch the switching portion from OFF to ON at the timing when, for example, the voltage is at its minimum.

For example, in the power source apparatus according to one or more embodiments of the present invention, it may be configured so that the predetermined threshold value is 10% or less than a maximum value of voltage between terminals of switching elements of the switching portion.

For example, in the power source apparatus according to one or more embodiments of the present invention, it may be configured so that the power source apparatus is further provided with an input detection unit for detecting input power of the power source apparatus and an output detection unit for detecting output power of the power source apparatus, and the control unit determines power efficiency based on the input power and the output power, and controls the duty ratio based on this power efficiency.

For example, in the power source apparatus according to one or more embodiments of the present invention, it may be configured so that the control unit controls so that the power efficiency becomes maximum by controlling the duty ratio.

Accordingly, by adjusting the duty ratio so that the power efficiency becomes its maximum, it is possible to switch the switching portion from OFF to ON at the timing when, for example, the voltage becomes its minimum, and it is possible to more accurately improve efficiency of the power source apparatus.

For example, in the power source apparatus according to one or more embodiments of the present invention, it may be configured so that the power source apparatus is further provided with a plurality of a first capacitor connected in parallel between the switching portion and ground, and the control unit controls a timing when the voltage becomes minimum or the minimum value of the voltage by switching the connection of the first capacitors.

Accordingly, by switching the connection of the first capacitors, the minimum point of the voltage can be moved in any direction. As a result, the minimum value of the voltage can be made to approach 0 (zero) V, and the efficiency of the power source apparatus can be more accurately improved.

For example, in the power source apparatus according to one or more embodiments of the present invention, it may be configured so that the power source apparatus is further provided with a plurality of a second capacitor connected in parallel between the switching portion and the load, and the control unit adjusts the timing when the voltage becomes minimum or the minimum value of the voltage by switching at least one of the connection of the plurality of first capacitor or the connection of the plurality of second capacitor.

Accordingly, by switching either the connection of the plurality first capacitor or the connection of the plurality of second capacitor, the minimum point of the voltage can be moved in any direction. As a result, the minimum value of the voltage can be made to approach 0 (zero) V, and the efficiency of the power source apparatus can be more accurately improved.

For example, in the power source apparatus according to one or more embodiments of the present invention, it may be configured so that the power source apparatus is further provided with a plurality of an inductor connected between the switching portion and the load, and the control unit controls the timing when the voltage becomes minimum or the minimum value of the voltage by switching at least one of the connection of the plurality of first capacitor, the connection of the plurality of second capacitor, or the connection of the plurality of inductor.

Accordingly, by switching any one of the connection of the plurality first capacitor, the connection of the plurality of second capacitor, or the connection of the plurality of inductor, the minimum point of the voltage can be moved in any direction. As a result, the minimum value of the voltage can be made to approach 0 (zero) V.

For example, in the power source apparatus according to one or more embodiments of the present invention, the control unit may be configured to switch the connection based on the duty ratio of the switching portion.

Accordingly, it is possible to make the duty ratio of the switching portion easily approach a prescribed value (for example, 50%) by switching the connection.

According to the power source apparatus in one or more embodiments of the present invention, efficiency can be sufficiently improved.

DETAILED DESCRIPTION

Hereinafter, embodiments of the present invention will be described with reference to drawings. Note that the embodiments described below all illustrate inclusive or specific examples. The values, shapes, materials, components, disposition location and connected state of the components, and the like, are only examples, and do not limit the present invention. Furthermore, components in the embodiments below that are not described in the claims are described as optional components. Each drawing does not always strictly disclose each dimension or each dimension ratio and the like.

[1-1. Circuit Configuration of the Power Source Apparatus]

Figure 1:
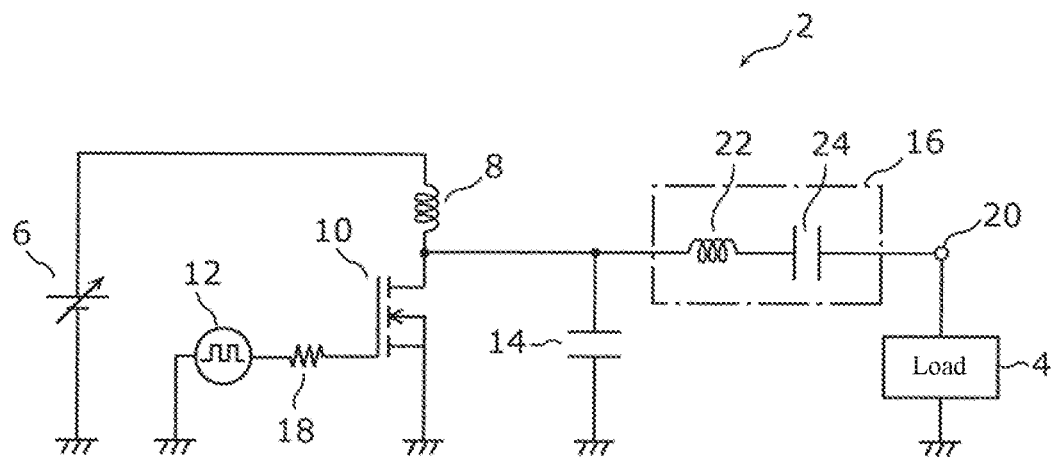
FIG. 1 is a circuit diagram illustrating the circuit configuration of the power source apparatus according to one or more embodiments of the present invention.

First, the circuit configuration of the power source apparatus 2 according to one or more embodiments of the present invention will be described referring to FIG. 1. FIG. 1 is a circuit diagram illustrating the circuit configuration of a power source apparatus 2 according to one or more embodiments of the present invention.

The power source apparatus 2 is a device for supplying power to a load 4. The power source apparatus 2 is, for example, a class E amplifier that converts DC power to AC power (high frequency power), and is mounted in a non-contact power source apparatus or the like.

As illustrated in FIG. 1, the power source apparatus 2 is provided with a DC power source 6, a choke coil 8, a switching element 10 (one example of a switching portion), a driving unit 12, a shunt capacitor 14, and a resonance circuit 16 as its circuit configuration.

The DC power source 6 is a variable power source for generating DC power. The DC power source 6 applies DC voltage between terminals of the switching element 10.

The choke coil 8 is connected between the DC power source 6 and a drain terminal (described later) of the switching element 10. The choke coil 8 substantially fixes the DC current from the DC power source 6.

The switching element 10 is an N-type MOSFET (metal oxide semiconductor field-effect transistor) having a gate terminal, a source terminal, and a drain terminal. The switching element 10 carries out an ON/OFF operation at high-frequency based on a switching signal (described later) from the driving unit 12. The source terminal of the switching element 10 is connected to ground. Note that instead of an N-type MOSFET, the switching element 10 may be a P-type MOSFET, or it may be a bipolar transistor or an IGBT (insulated gate bipolar transistor) or the like.

The driving unit 12 is connected to the gate terminal of the switching element 10 via a gate resistor 18. The driving unit 12 generates the switching signal for carrying out the ON/OFF operation of the switching element 10. The driving unit 12 outputs the generated switching signal to the gate terminal of the switching element 10. Note that the gate resistor 18 connected between the driving unit 12 and the gate terminal of the switching element 10 is for suppressing parasitic oscillation and the like.

Figure 4A:
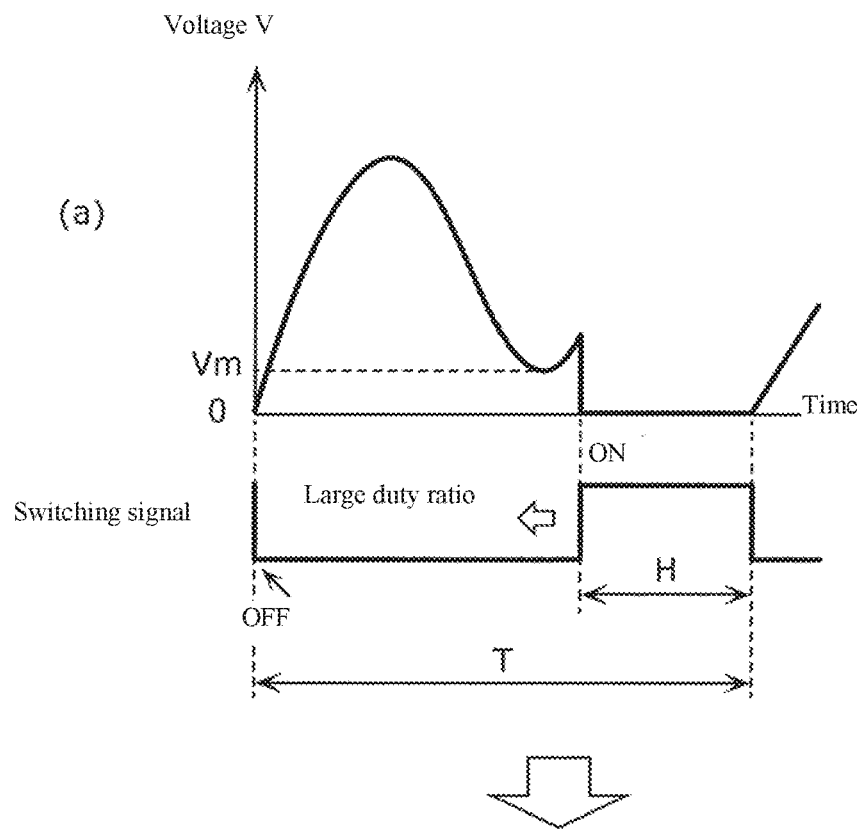
FIG. 4A is a graph showing the relationship between a voltage and a switching signal between terminals of the switching element in the power source apparatus according to one or more embodiments of the present invention.

As illustrated in FIG. 4A described hereinafter, the switching signal is a pulse signal that repeats a high and a low at a fixed cycle T. Note that the switching signal is generated by comparing a triangular wave from a triangular wave generating circuit, and a reference voltage from a DAC (digital analog converter).

When the switching signal rises from low to high, the switching element 10 switches from OFF to ON, and power flows from the drain terminal to the source terminal. When the switching signal drops from high to low, the switching element 10 switches from ON to OFF, and power does not flow from the drain terminal to the source terminal. Note that the frequency of the switching signal is the same as the frequency of the AC power output from an output terminal 20.

The shunt capacitor 14 is connected in parallel to the switching element 10. In other words, the shunt capacitor 14 is connected between the drain terminal of the switching element 10 and ground. When the switching element 10 is OFF, DC power from the DC power source 6 is charged to the shunt capacitor 14 via the choke coil 8.

The resonance circuit 16 has a series inductor 22 and a series capacitor 24 connected in series. The resonance circuit 16 is connected between the drain terminal of the switching element 10 and the output terminal 20 (load 4). The resonance circuit 16 has a peculiar frequency near the frequency of the AC power output from the output terminal 20. Note that the load 4 is connected to the output terminal 20.

[1-2. Functional Composition of the Power Source Apparatus]

Figure 2:
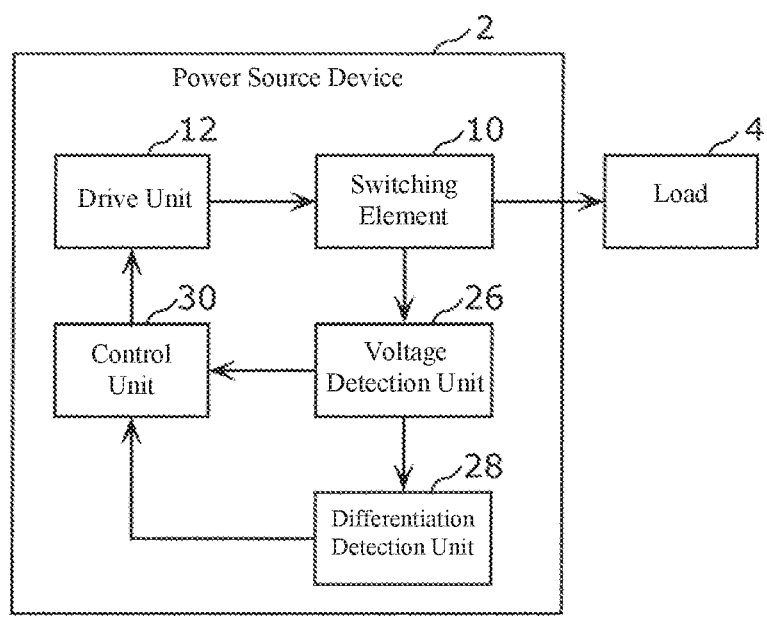
FIG. 2 is a block diagram illustrating the functional configuration of the power source apparatus according to one or more embodiments of the present invention.

Next, the functional configuration of the power source apparatus 2 according to one or more embodiments of the present invention will be described referring to FIG. 2. FIG. 2 is a block diagram illustrating the functional configuration of the power source apparatus 2 according to one or more embodiments of the present invention.

As illustrated in FIG. 2, the power source apparatus 2 is provided with a voltage detection unit 26 (one example of a detection unit), a differentiation detection unit 28, and a control unit 30 as a functional configuration.

The voltage detection unit 26 detects voltage between terminals of the switching element 10, or more specifically, the voltage between the drain terminal and the source terminal.

The differentiation detection unit 28 detects a differentiation value of the voltage (in other words, a slope of the voltage), based on the voltage detected by the voltage detection unit 26.

The control unit 30 controls the driving unit 12 based on the voltage detected by the voltage detection unit 26 and the differentiation value detected by the differentiation detection unit 28. Specifically, the control unit 30 switches the switching element 10 from OFF to ON at the timing when the voltage becomes minimum (in other words, when the voltage is below a predetermined threshold) by adjusting a duty ratio of the switching signal (in other words, the duty ratio of the switching element 10). Note that the predetermined threshold is a value at the minimum voltage value or greater, and is, for example, 10% or less than the greatest voltage value between terminals of the switching element 10. Furthermore, "voltage becoming minimum" refers to when voltage changes from reducing to increasing, and when the differentiation value of the voltage becomes 0 (zero). At this time, the minimum voltage may not be a strict minimum value, and may be a voltage around the vicinity thereof. In one or more embodiments of the invention, the control unit 30 may have functions of the units described above or later, such as driving unit 12 and voltage detection unit 26.

Here, as illustrated in FIG. 4A described hereinafter, when the cycle of the switching signal is T and the ON period (period when the switching signal is high) is H, the duty ratio is expressed by $H/T \times 100$ (%). The control unit 30 adjusts the duty ratio of the switching signal by changing the ON period H.

[1-3. Operation of the Power Source Apparatus]

Figure 3:
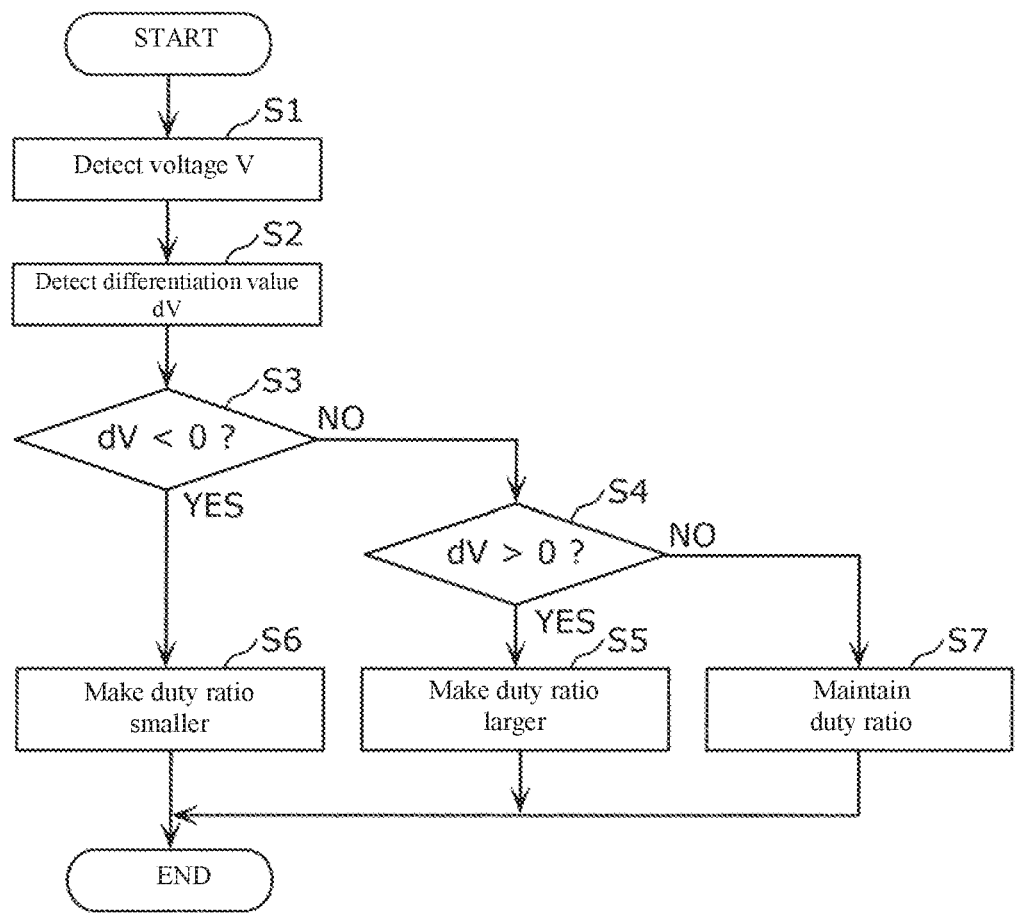
FIG. 3 is a flowchart illustrating the flow of operations of the power source apparatus according to one or more embodiments of the present invention.
Figure 4A:
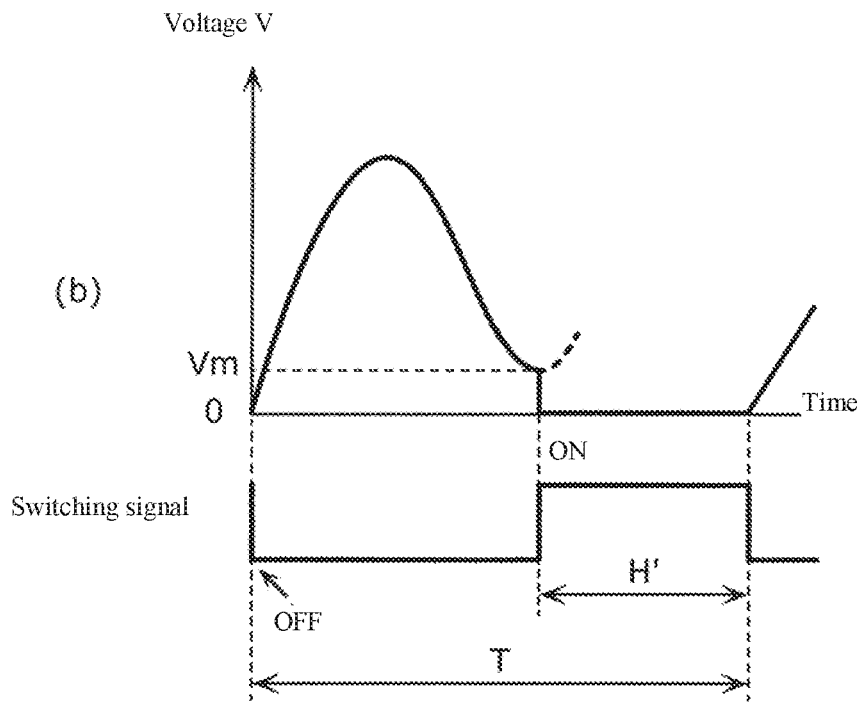
Figure 4B:
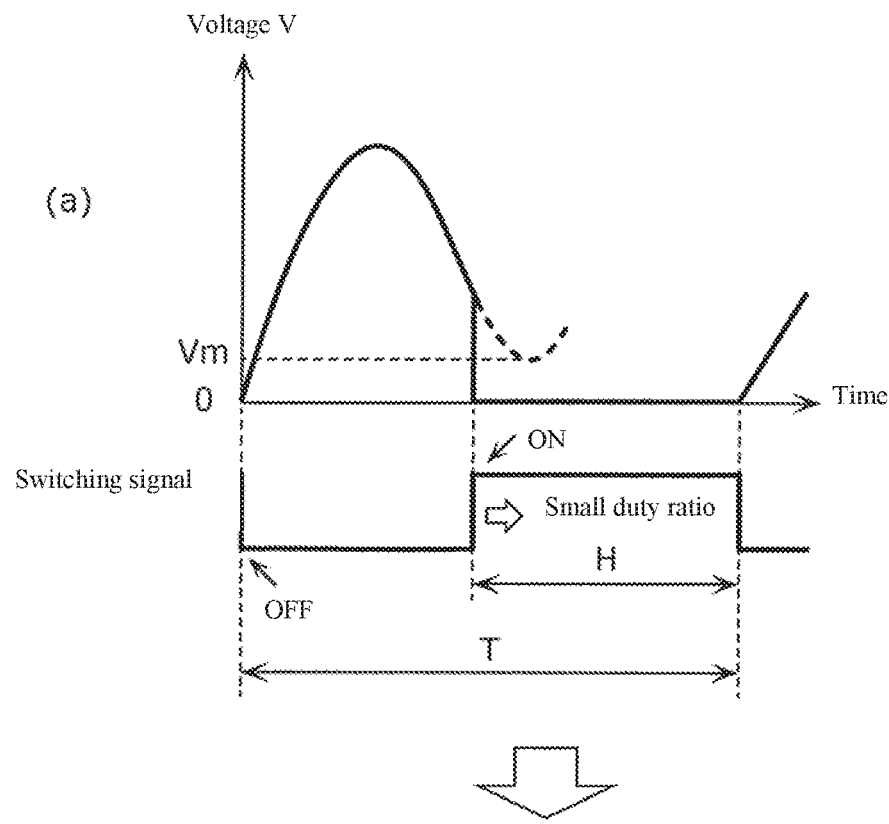
FIG. 4B is a graph showing the relationship between a voltage and a switching signal between terminals of the switching element in the power source apparatus according to one or more embodiments of the present invention.

Next, the operation of the power source apparatus 2 according to one or more embodiments of the present invention will be described referring to FIG. 3 to FIG. 4B. FIG. 3 is a flowchart illustrating the operations of the power source apparatus 2 according to one or more embodiments of the present invention. FIG. 4A and FIG. 4B are graphs showing the relationship between a voltage V between terminals of the switching element 10 and a switching signal in the power source apparatus 2 according to one or more embodiments of the present invention.

As illustrated in (a) of FIG. 4A, when the switching element 10 is switched from ON to OFF, the voltage V between terminals of the switching element 10 raises from 0 (zero) V by DC power from the DC power source 6 being charged to the shunt capacitor 14. After this, the voltage V between terminals of the switching element 10 reduces due to discharging of the shunt capacitor 14 beginning by the operation of the resonance circuit 16. After this, the voltage V between terminals of the switching element 10 rises from minimum voltage Vm due to charging to the shunt capacitor 14 beginning again. Meanwhile, when the switching element 10 is switched from OFF to ON, the voltage V between terminals of the switching element 10 instantly reduces to 0 (zero). The same operations are repeated below.

One or more embodiments of the present invention are characterized by the operation for switching the switching element 10 from OFF to ON at the timing when the voltage V becomes a minimum value Vm (in other words, the voltage V becomes minimum) by adjusting the duty ratio of the switching signal. This characteristic operation will be described in detail below.

As illustrated in FIG. 3, the voltage detection unit 26 detects the voltage V between terminals of the switching element 10 (S1). Afterward, the differentiation detection unit 28 detects the differentiation value dV of the voltage V based on the voltage V detected by the voltage detection unit 26 (S2). After this, the control unit 30 determines whether the differentiation value dV at the timing when the switching element 10 switches from OFF to ON is a negative value (S3, S4).

In the example illustrated in (a) of FIG. 4A, the switching element 10 switches from OFF to ON directly after the voltage V rises from the minimum value Vm. In this case, the control unit 30 determines that the differentiation value dV is a positive value at the timing when the switching element 10 switches from OFF to ON (NO in S3, YES in S4), and makes the duty ratio of the switching signal larger (S5). By this, as illustrated in (b) of FIG. 4A, by an ON period H' of the switching signal increasing (in other words, the timing when the switching signal rises from low to high is earlier), the switching element 10 switches from OFF to ON at the timing when the voltage V becomes the minimum value Vm.

Meanwhile, in the example illustrated in (a) of FIG. 4B, the switching element 10 switches from OFF to ON directly before the voltage V reduces to the minimum value Vm. In this case, the control unit 30 determines that the differentiation value dV is a negative value at the timing when the switching element 10 switches from OFF to ON (YES in S3), and makes the duty ratio of the switching signal smaller (S6). By this, as illustrated in (b) of FIG. 4B, by the ON period H' of the switching signal decreasing (in other words, the timing when the switching signal rises from low to high is later), the switching element 10 switches from OFF to ON at the timing when the voltage V becomes the minimum value Vm.

Note that the control unit 30 maintains the duty ratio of the switching signal (S7) when it is determined that the differentiation value dV is 0 (zero) at the timing when the switching element 10 switches from OFF to ON (NO in S3, NO in S4). In other words, in this case, because it is thought that the switching element 10 switches from OFF to ON at the timing when the voltage V becomes the minimum voltage Vm, the duty ratio of the switching signal does not have to be adjusted.

[1-4. Effect]

Next, the effects obtained by the power source apparatus 2 according to one or more embodiments of the present invention will be described. As described above, the duty ratio of the switching signal is adjusted so that the switching element 10 switches from OFF to ON at the timing when the voltage V becomes the minimum value Vm. Because the duty ratio of the switching signal can be continuously adjusted, the switching element 10 can accurately switch from OFF to ON at the timing when the voltage V becomes the minimum value Vm. As a result, switching loss can be sufficiently suppressed to be small, and the efficiency of the power source apparatus 2 can be sufficiently improved.

[2-1. Circuit Configuration of the Power Source Apparatus]

Figure 5:
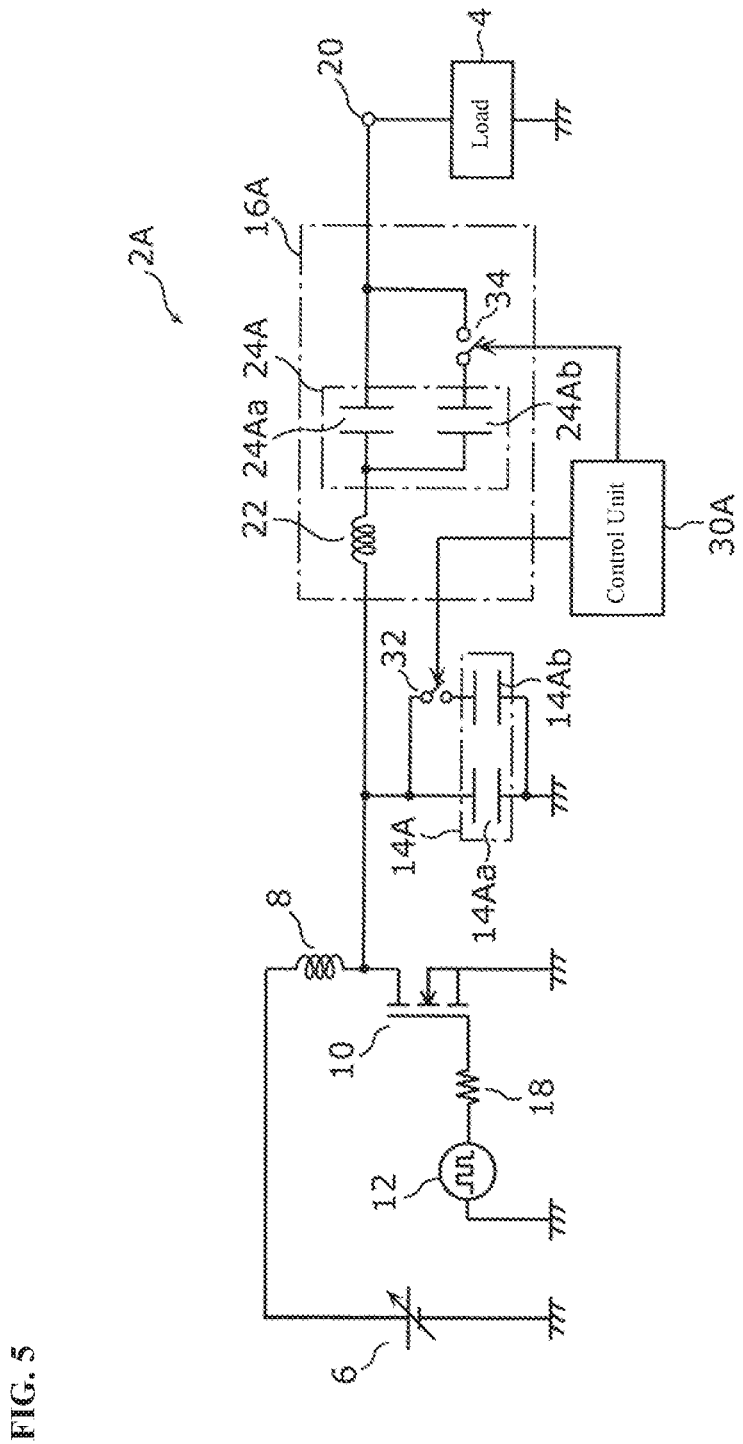
FIG. 5 is a circuit diagram illustrating the circuit configuration of the power source apparatus according to one or more embodiments of the present invention.

Next, the circuit configuration of a power source apparatus 2A according to one or more embodiments of the present invention will be described referring to FIG. 5. FIG. 5 is a circuit diagram illustrating the circuit configuration of the power source apparatus 2A according to one or more embodiments of the present invention. Note that in the embodiments discussed below, the same reference numerals will be given to the same components in the aforementioned embodiments of the present invention, and descriptions thereof will be omitted.

As illustrated in FIG. 5, the power source apparatus 2A differs in that it is provided with a shunt capacitor group 14A, a series capacitor group 24A, a first switching switch 32, and a second switching switch 34.

The shunt capacitor group 14A has two shunt capacitors 14Aa and 14Ab (one example of plurality of a first capacitor) connected in parallel.

The first switching switch 32 is connected in series to the shunt capacitor 14Ab. The first switching switch 32 is a switch for switching the connection of the two shunt capacitors 14Aa and 14Ab. Specifically, when the first switching switch 32 is turned ON, the shunt capacitor 14Ab is connected in parallel to the shunt capacitor 14Aa. At this time, an entire capacitance C1 of the shunt capacitor group 14A is equal to a combined capacitance $C1a+C1b$, of the capacitance $C1a$ of the shunt capacitor 14Aa and the capacitance $C1b$ of the shunt capacitor 14Ab. Meanwhile, when the first switching switch 32 is turned OFF, the shunt capacitor 14Ab is disconnected from the shunt capacitor 14Aa. At this time, the entire capacitance C1 of the shunt capacitor group 14A is equal to the capacitance $C1a$ of the shunt capacitor 14Aa ($<C1a+C1b$).

The series capacitor group 24A configures one portion of the resonance circuit 16A, and has two series capacitors 24Aa and 24Ab (one example of a plurality of second capacitors) connected in parallel.

The second switching switch 34 is connected in series to the series capacitor 24Ab. The second switching switch 34 is a switch for switching the connection of the two series capacitors 24Aa and 24Ab. Specifically, when the second switching switch 34 is turned ON, the series capacitor 24Ab is connected in parallel to the series capacitor 24Aa. At this time, an entire capacitance C2 of the series capacitor group 24A is equal to a combined capacitance $C2a+C2b$, of the capacitance $C2a$ of the series capacitor 24Aa and the capacitance $C2b$ of the series capacitor 24Ab. Meanwhile, when the second switching switch 34 is turned OFF, the series capacitor 24Ab is disconnected from the series capacitor 24Aa. At this time, the entire capacitance C2 of the series capacitor group 24A is equal to the capacitance C2a of the series capacitor 24Aa (<C2a+C2b).

The control unit 30A controls each ON/OFF operation of the first switching switch 32 and the second switching switch 34 based on the voltage detected by the voltage detection unit 26 (see FIG. 2), the differentiation value detected by the differentiation detection unit 28 (see FIG. 2), and the duty ratio of the switching signal.

[2-2. Operation of the Power Source Apparatus]

Figure 6:
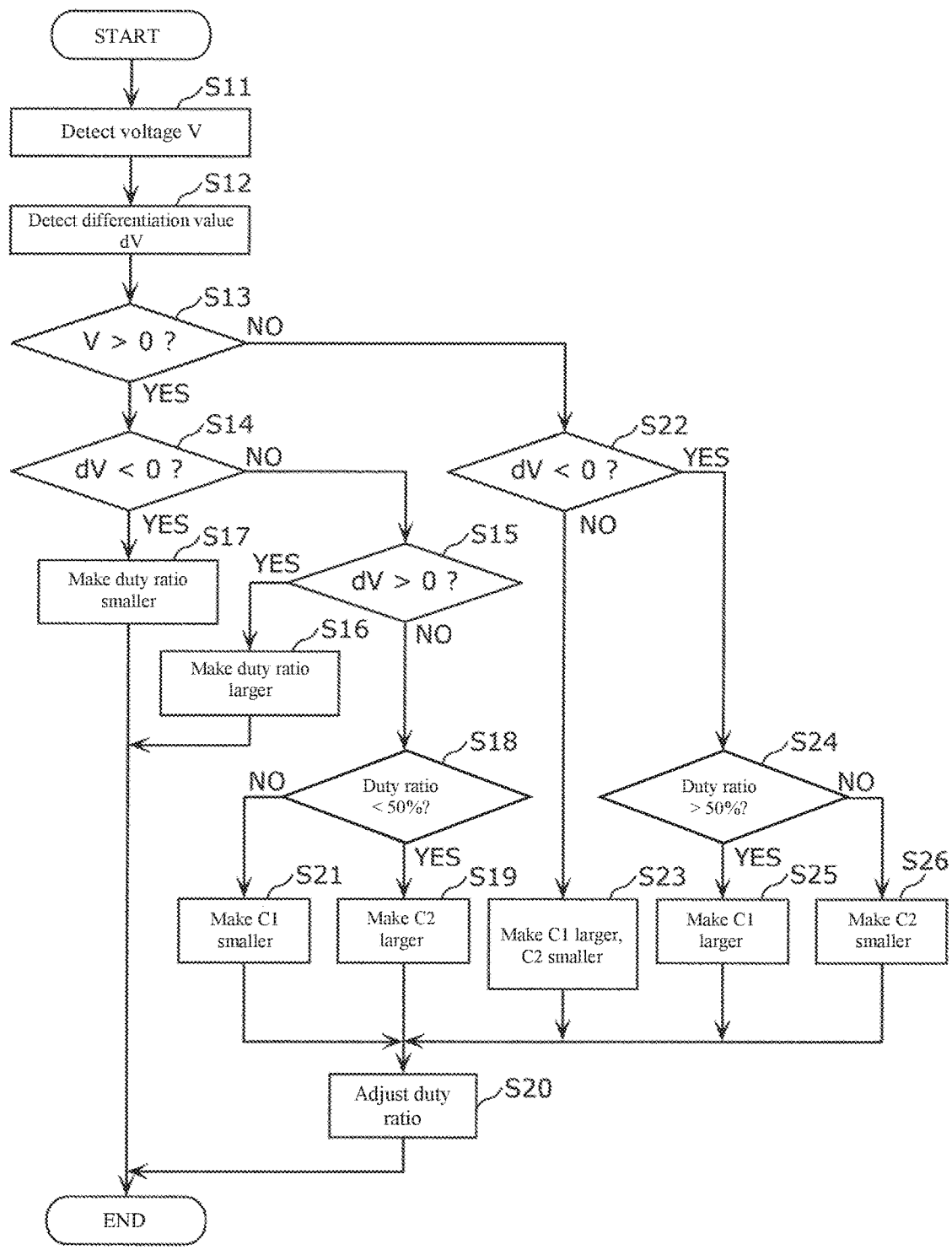
FIG. 6 is a flowchart illustrating the flow of operations of the power source apparatus according to one or more embodiments of the present invention.

Next, the operation of the power source apparatus 2A according to one or more embodiments of the present invention will be described referring to FIG. 6 to FIG. 7E. FIG. 6 is a flow chart illustrating the flow of operations of the power source apparatus 2A according to one or more embodiments of the present invention. FIG. 7A to FIG. 7E are graphs showing the relationship between the voltage V between terminals of the switching element 10 and the switching signal in the power source apparatus 2A according to one or more embodiments of the present invention.

One or more embodiments of the present invention are characterized to carry out an operation for switching either the connection of the two shunt capacitors 14Aa and 14Ab or the connection of the two series capacitors 24Aa and 24Ab in addition to the operation for adjusting the duty ratio of the switching signal so that the switching element 10 switches from OFF to ON when the voltage V becomes the minimum value Vm. This characteristic operation will be described in detail below.

As illustrated in FIG. 6, the voltage detection unit 26 detects the voltage V between terminals of the switching element 10 (S11). Afterward, the differentiation detection unit 28 detects the differentiation value dV of the voltage V based on the voltage V detected by the voltage detection unit 26 (S12).

Afterward, a control unit 30A makes the duty ratio of the switching signal larger (S16) in the same manner as step S5 described in the aforementioned embodiments of the present invention (YES in S13, NO in S14, YES in S15) when the voltage V and the differentiation value dV are both positive values at the timing when the switching element 10 switches from OFF to ON.

Returning to step S13, and the control unit 30A makes the duty ratio of the switching signal smaller (S17) in the same manner as step S6 described in the aforementioned embodiments of the present invention when the voltage V is a positive value (YES in S13) and the differentiation value dV is a negative value (YES in S14) at the timing when the switching element 10 switches from OFF to ON.

In other words, when the voltage V is a positive value and the differential value dV is a positive value or a negative value, the operation is performed in the same manner as described in the aforementioned embodiments of the present invention.

Figure 7A:
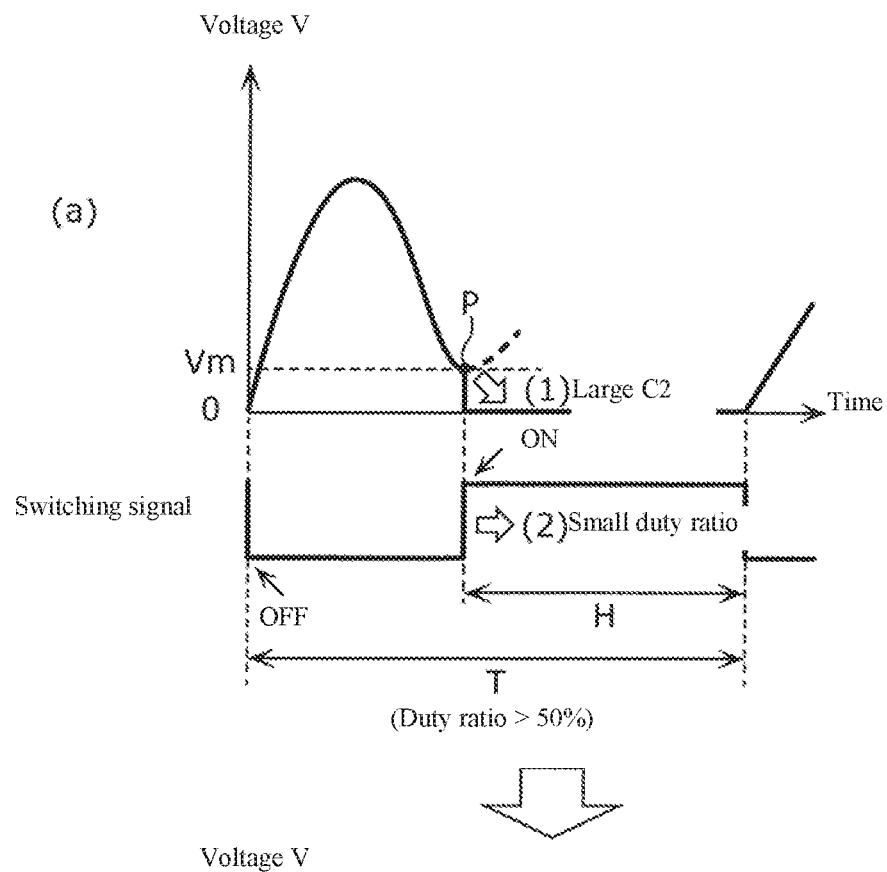
FIG. 7A is a graph showing the relationship between a voltage and a switching signal between terminals of the switching element in the power source apparatus according to one or more embodiments of the present invention.
Figure 7A:
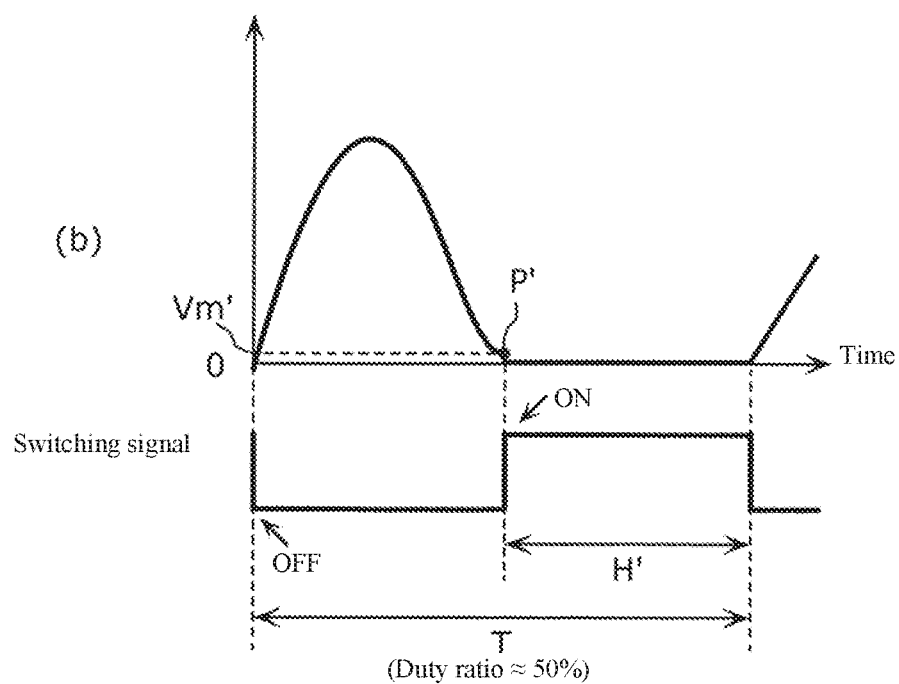
Figure 7B:
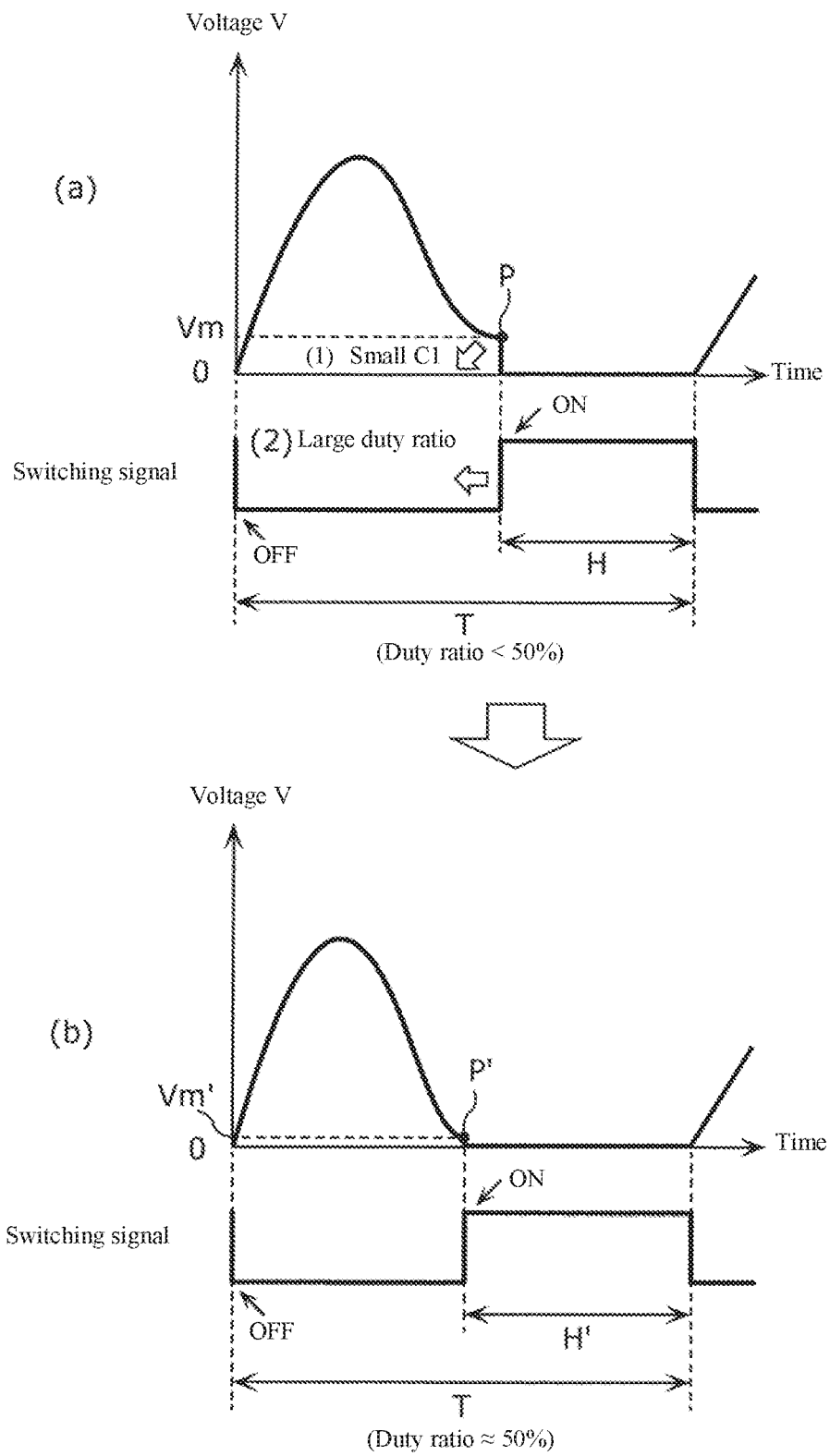
FIG. 7B is a graph showing the relationship between a voltage and a switching signal between terminals of the switching element in the power source apparatus according to one or more embodiments of the present invention.

Returning to step S13, as illustrated in (a) of FIG. 7A, when the voltage V is a positive value (YES in S13) and the differentiation value dV is 0 (zero) (NO in S14, NO in S15) at the timing when the switching element 10 switches from OFF to ON, the control unit 30A determines whether the duty ratio of the switching signal exceeds 50% (S18).

When the duty ratio of the switching signal does exceed 50% (YES in S18), the control unit 30A makes the entire capacitance C2 of the series capacitor group 24A larger by turning the second switching switch 34 ON (S19). As illustrated in (a) and (b) of FIG. 7A, by making the entire capacitance C2 of the series capacitor group 24A larger, the minimum point of the voltage V moves from a minimum point P diagonally downward and right to a minimum point P' in FIG. 7A. Along with this, the minimum value of the voltage V reduces from the minimum value Vm to a minimum value Vm' (<Vm). Note that the minimum point is the point in which the voltage V changes from reducing to increasing, having the voltage and time when the differentiation value dV of the voltage V becomes 0 (zero) as its parameters. Afterward, the control unit 30A makes the duty ratio of the switching signal smaller so that the switching element 10 switches from OFF to ON at the timing when the voltage V becomes the minimum value Vm' (S20). By this, the duty ratio of the switching signal is adjusted in the direction near 50%.

Returning to step S18, when the duty ratio of the switching signal does not exceed 50% (NO in S18), the control unit 30A makes the entire capacitance C1 of the shunt capacitor group 14A smaller by turning the first switching switch 32 OFF (S21). As illustrated in (a) and (b) of FIG. 7B, by making the entire capacitance C1 of the shunt capacitor group 14A smaller, the minimum point of the voltage V moves from the minimum point P diagonally downward and left to the minimum point P' in FIG. 7B. Along with this, the minimum value of the voltage V reduces from the minimum value Vm to a minimum value Vm' (<Vm). Afterward, the control unit 30A makes the duty ratio of the switching signal larger so that the switching element 10 switches from OFF to ON at the timing when the voltage V becomes the minimum value Vm' (S20). By this, the duty ratio of the switching signal is adjusted in the direction near 50%.

Figure 7C:
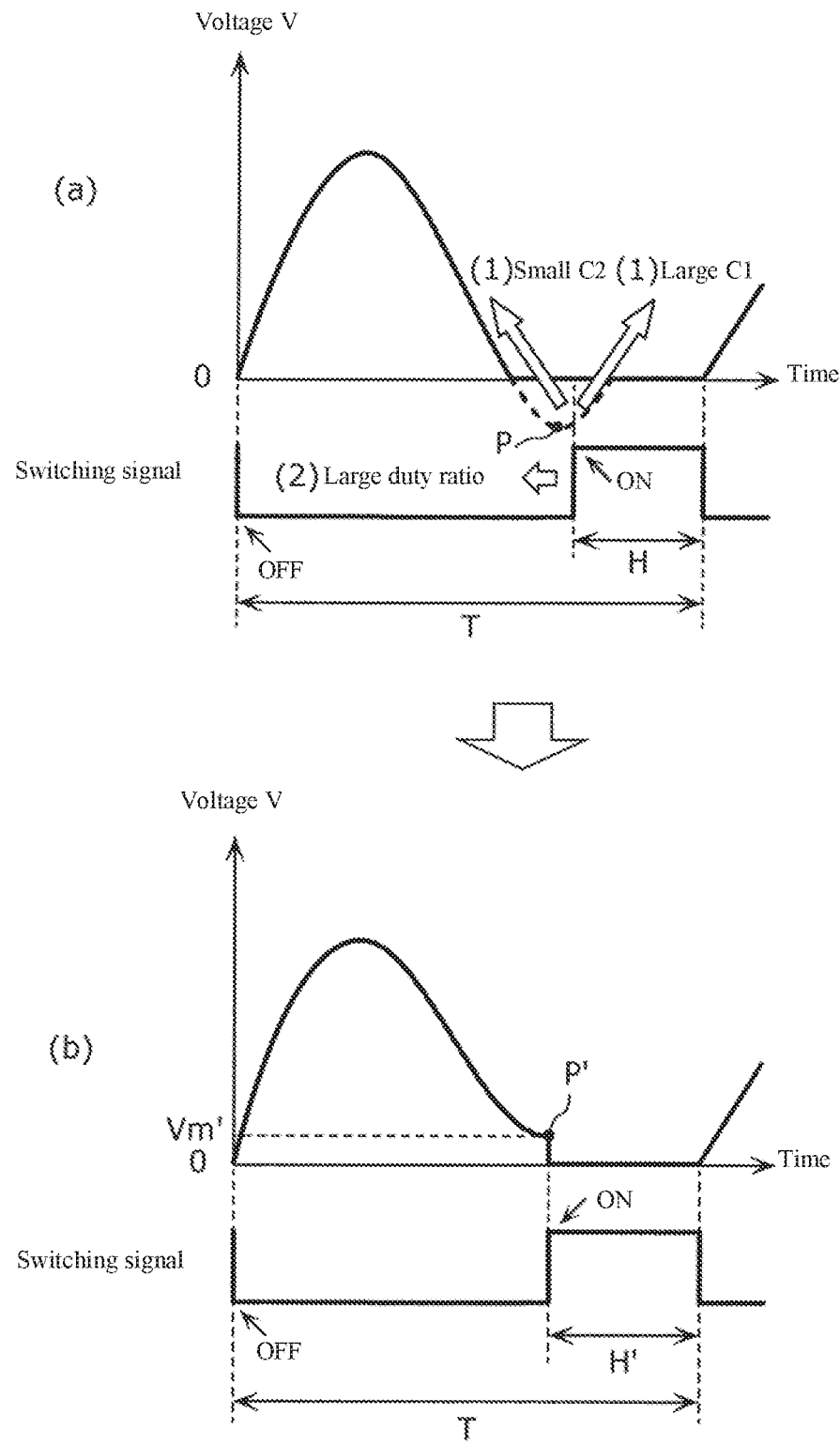
FIG. 7C is a graph showing the relationship between a voltage and a switching signal between terminals of the switching element in the power source apparatus according to one or more embodiments of the present invention.

Returning to step S13, as illustrated in (a) of FIG. 7C, when the voltage V is 0 (zero) (NO in S13) and the differentiation value dV is 0 (zero) (NO in S22) at the timing when the switching element 10 switches from OFF to ON, the control unit 30A makes the entire capacitance C1 of the shunt capacitor group 14A larger by turning the first switching switch 32 ON and makes the entire capacitance C2 of the series capacitor group 24A smaller by turning the second switching switch 34 OFF (S23). Here, the minimum point of the voltage V moves diagonally upward right in FIG. 7C by making the entire capacitance C1 of the shunt capacitor group 14A larger. Furthermore, the minimum point of the voltage V moves diagonally upward left in FIG. 7C by making the entire capacitance C2 of the series capacitor group 24A smaller. As illustrated in (a) and (b) of FIG. 7C, when the entire capacitance C1 of the shunt capacitor group 14A is made larger and the entire capacitance C2 of the series capacitor group 24A is made smaller, the minimum point of the voltage V moves from the minimum point P (region of negative voltage) directly upward in FIG. 7C to the minimum point P' (region of positive voltage). Afterward, the control unit 30A, for example, makes the duty ratio of the switching signal larger so that the switching element 10 switches from OFF to ON at the timing when the voltage V becomes the minimum value Vm' (>0) (S20).

Figure 7D:
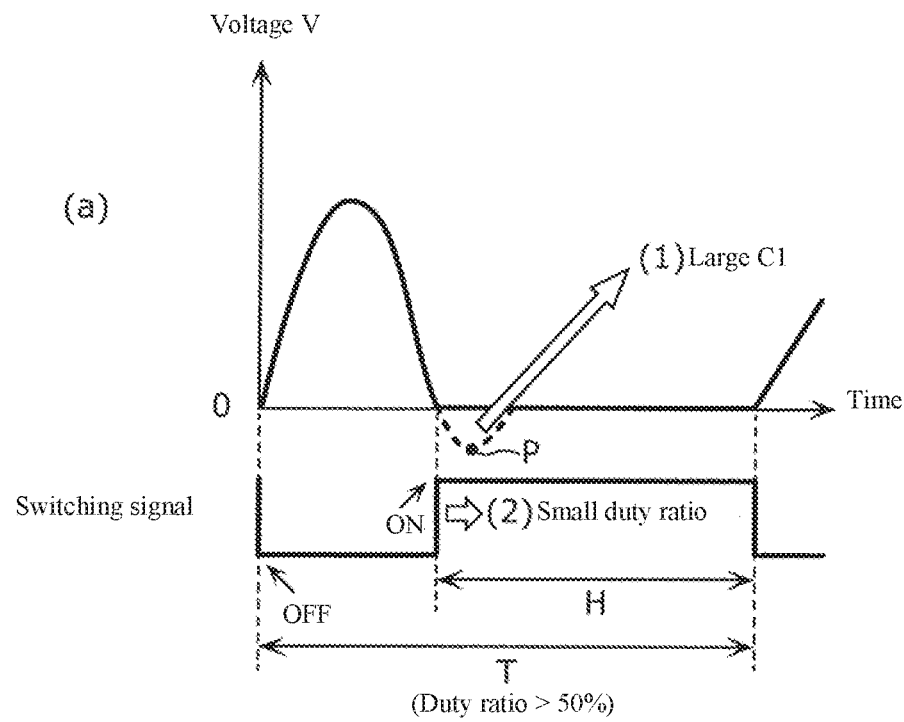
FIG. 7D is a graph showing the relationship between a voltage and a switching signal between terminals of the switching element in the power source apparatus according to one or more embodiments of the present invention.
Figure 7D:
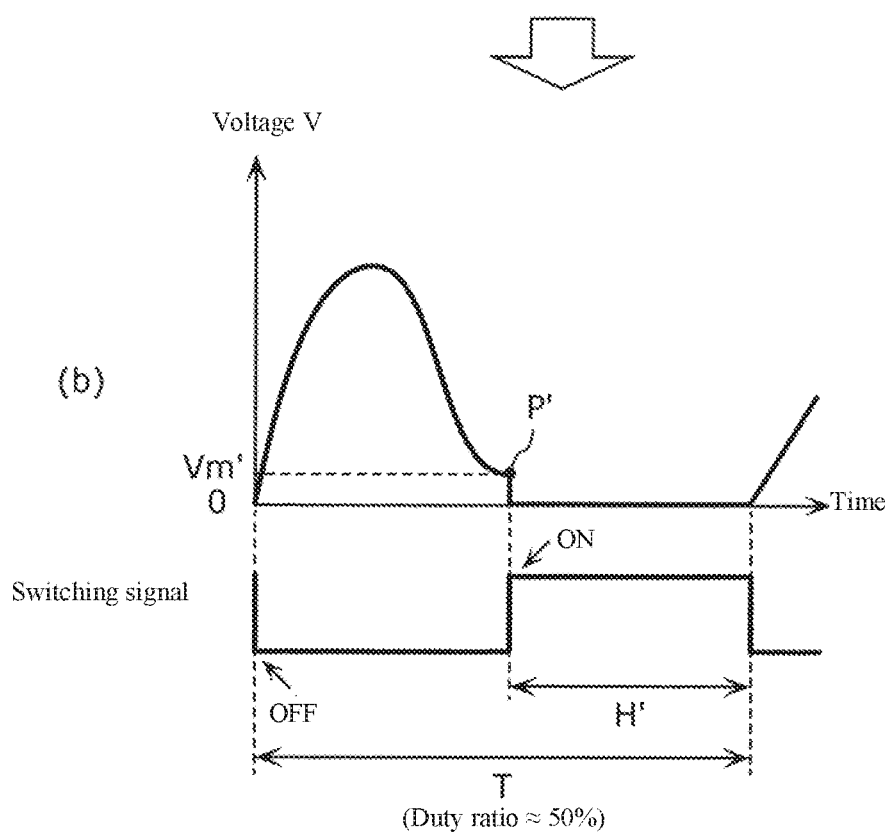
Figure 7E:
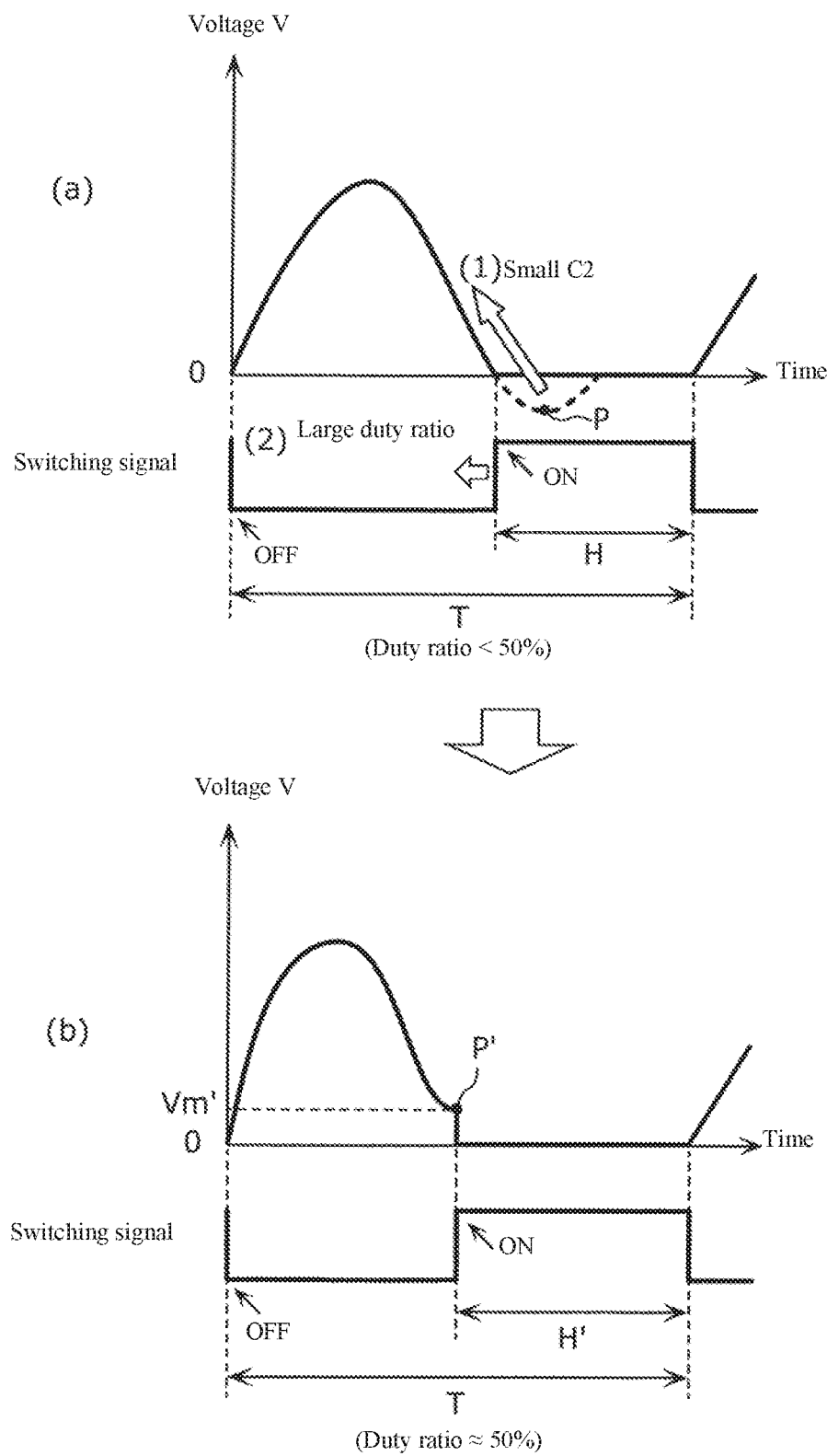
FIG. 7E is a graph showing the relationship between a voltage and a switching signal between terminals of the switching element in the power source apparatus according to one or more embodiments of the present invention.

Returning to step S13, as illustrated in (a) of FIG. 7D, when the voltage V is 0 (zero) (NO in S13) and the differentiation value dV is a negative value (YES in S22) at the timing when the switching element 10 switches from OFF to ON, the control unit 30A determines whether the duty ratio of the switching signal exceeds 50% (S24).

When the duty ratio of the switching signal does exceed 50% (YES in S24), the control unit 30A makes the entire capacitance C1 of the shunt capacitor group 14A larger by turning the first switching switch 32 ON (S25). As illustrated in (a) and (b) of FIG. 7D, by making the entire capacitance C1 of the shunt capacitor group 14A larger, the minimum point of the voltage V moves from the minimum point P (region of negative voltage) diagonally upward right to the minimum point P' (region of positive voltage) in FIG. 7D. Afterward, the control unit 30A makes the duty ratio of the switching signal smaller so that the switching element 10 switches from OFF to ON at the timing when the voltage V becomes the minimum value Vm' (>0) (S20). By this, the duty ratio of the switching signal is adjusted in the direction near 50%.

Returning to step S24, when the duty ratio of the switching signal does not exceed 50% (NO in S24), the control unit 30A makes the entire capacitance C2 of the series capacitor group 24A smaller by turning the second switching switch 34 OFF (S26). As illustrated in (a) and (b) of FIG. 7E, by making the entire capacitance C2 of the series capacitor group 24A smaller, the minimum point of the voltage V moves from the minimum point P (region of negative voltage) diagonally upward left to the minimum point P' (region of positive voltage) in FIG. 7E. Afterward, the control unit 30A makes the duty ratio of the switching signal larger so that the switching element 10 switches from OFF to ON at the timing when the voltage V becomes the minimum value Vm' (>0) (S20). By this, the duty ratio of the switching signal is adjusted in the direction near 50%.

[2-3. Effect]

Next, the effects obtained by the power source apparatus 2A according to one or more embodiments of the present invention will be described. In one or more embodiments of the present invention, as described above, an operation is carried out for switching either the connection of the two shunt capacitors 14Aa and 14Ab or the connection of the two series capacitors 24Aa and 24Ab. By this, because the minimum value Vm of the timing or voltage V when the voltage V becomes a minimum is adjusted, the minimum point of the voltage V can be moved in any direction. As a result, the minimum value Vm of the voltage V can be made near 0 (zero) V, and the efficiency of the power source apparatus 2A can be more accurately improved.

Additionally, because the connections described above are switched based on the duty ratio of the switching signal, the duty ratio of the switching signal can easily be made to be near a prescribed value (for example, 50%). As a result, efficiency of the power source apparatus 2A can be further improved.

[2-4. Variations]

Figure 8:
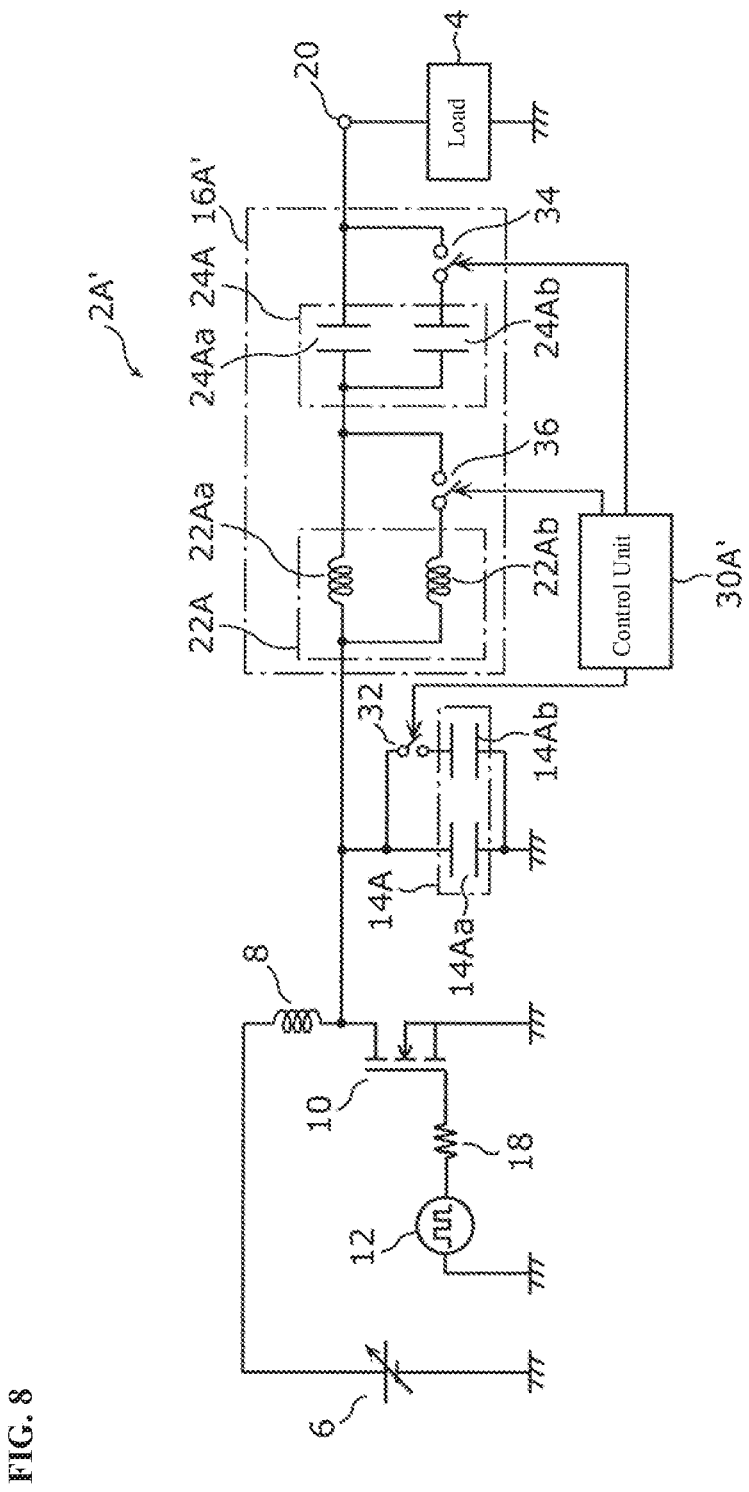
FIG. 8 is a circuit diagram illustrating the circuit configuration of the power source apparatus according to one or more embodiments of the present invention.

Here, the circuit configuration of a power source apparatus 2A' according to a variation of the aforementioned embodiments of the present invention will be described referring to FIG. 8. FIG. 8 is a circuit diagram illustrating the circuit configuration of the power source apparatus 2A' according to one or more embodiments of the present invention.

As illustrated in FIG. 8, the power source apparatus 2A' according to the variation of the aforementioned embodiments of the present invention is provided with a series inductor group 22A and a third switching switch 36 in addition to the shunt capacitor group 14A and the series capacitor group 24A.

The series inductor group 22A configures one portion of a resonance circuit 16A', and has two series inductors 22Aa and 22Ab (one example of plurality of inductors) connected in parallel. The third switching switch 36 is connected in series to the series inductor 22Ab. A control unit 30A' controls the connection of the two series inductors 22Aa and 22Ab by turning the third switching switch 36 ON/OFF.

An entire reactance L of the series inductor group 22A can be changed by switching the connection of the series inductors 22Aa and 22Ab. By making the entire reactance L smaller, the minimum point of the voltage V moves diagonally upward left in FIG. 7A and the like. Meanwhile, the minimum point of the voltage V moves diagonally downward and right in FIG. 7A and the like by making the entire reactance L larger.

Therefore, the minimum point of the voltage V can be moved in any direction by any one of the connection of the two shunt capacitors 14Aa and 14Ab, the connection of the two series capacitors 24Aa and 24Ab, or the connection of the two series inductors 22Aa and 22Ab being switched.

Note that the series inductor group 22A has two series inductors 22Aa and 22Ab in the present variation, but may have three or more series conductors. The same is true about the shunt capacitor group 14A and the series capacitor group 24A.

[3-1. Circuit Configuration of the Power Source Apparatus]

Figure 9:
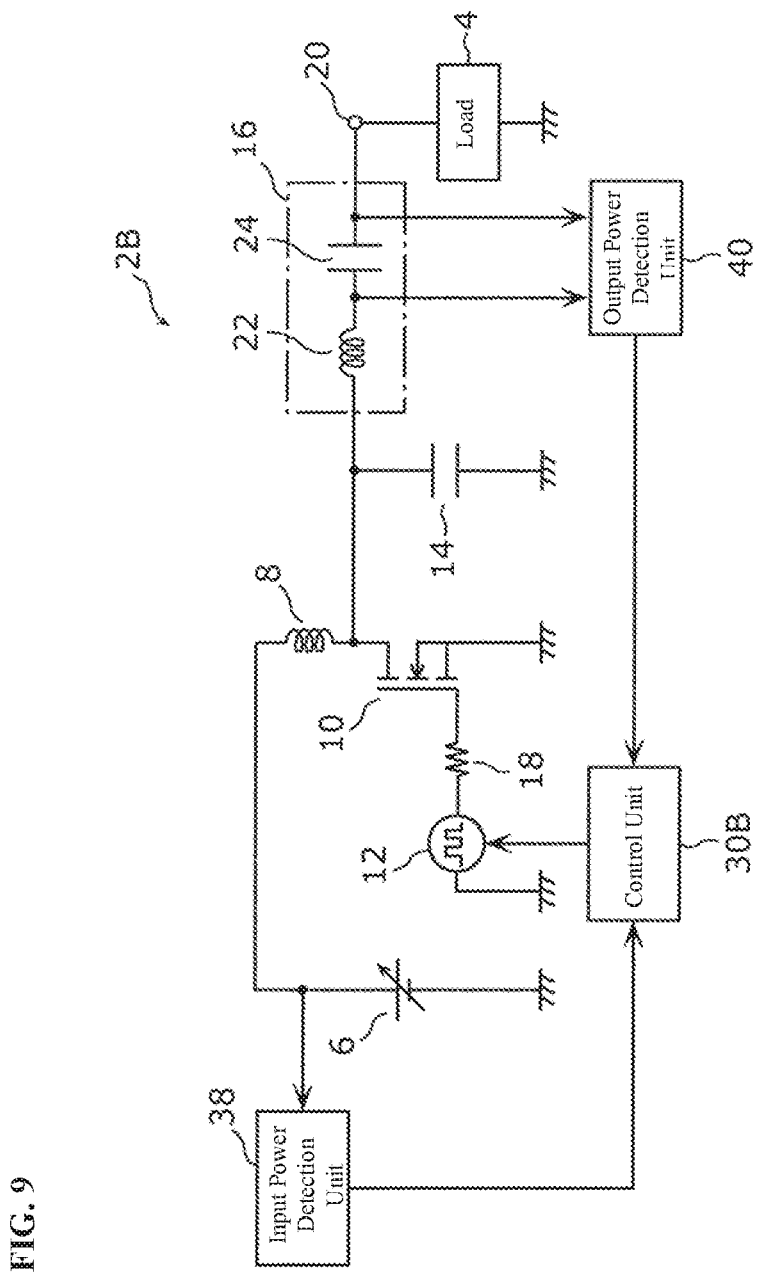
FIG. 9 is a circuit diagram illustrating the circuit configuration of the power source apparatus according to one or more embodiments of the present invention.

Next, a power source apparatus 2B according to one or more embodiments of the present invention will be described referring to FIG. 9. FIG. 9 is a circuit diagram illustrating the circuit configuration of the power source apparatus 2B according to one or more embodiments of the present invention.

As illustrated in FIG. 9, the power source apparatus 2B according to one or more embodiments of the present invention is provided with an input power detection unit 38 and an output power detection unit 40 in addition to the components of the power source apparatus 2 in the aforementioned embodiments of the present invention.

The input power detection unit 38 detects input power Wi of the power source apparatus 2B. Specifically, the input power detection unit 38 detects the voltage and current output from the DC power source 6, and detects the input power Wi by calculating the product of this voltage and current.

The output power detection unit 40 detects output power Wo of the power source apparatus 2B. Specifically, the output power detection unit 40 detects the output power Wo by carrying out orthogonal demodulation of each voltage on both ends of the series capacitor 24, calculating the current from the difference of voltage between both ends and the capacitance of the series capacitor 24, and calculating a real number component of the product of one of the voltages of both ends and the current.

The control unit 30B calculates power efficiency based on the input power Wi and the output power Wo (=Wo/Wi), and adjusts the duty ratio of the switching signal based on the power efficiency. Specifically, a control unit 30B adjusts the duty ratio of the switching signal so that the switching element 10 is switched from OFF to ON at the timing when the voltage V becomes minimum so that the power efficiency is a maximum value (Wo/Wi=1). Note that when the voltage V is 0 (zero) and the differentiation value dV is 0 (zero), it is obvious that power efficiency is at its maximum value.

[3-2. Effect]

Therefore, switching loss can be sufficiently suppressed to be small, and efficiency of the power source apparatus 2B can be sufficiently improved.

Note that the input power detection unit 38 and the output power detection unit 40 may be added to the components of the power source apparatus 2A (2A') of the aforementioned embodiments of the present invention.

[4-1. Circuit Configuration of the Power Source Apparatus]

Figure 10:
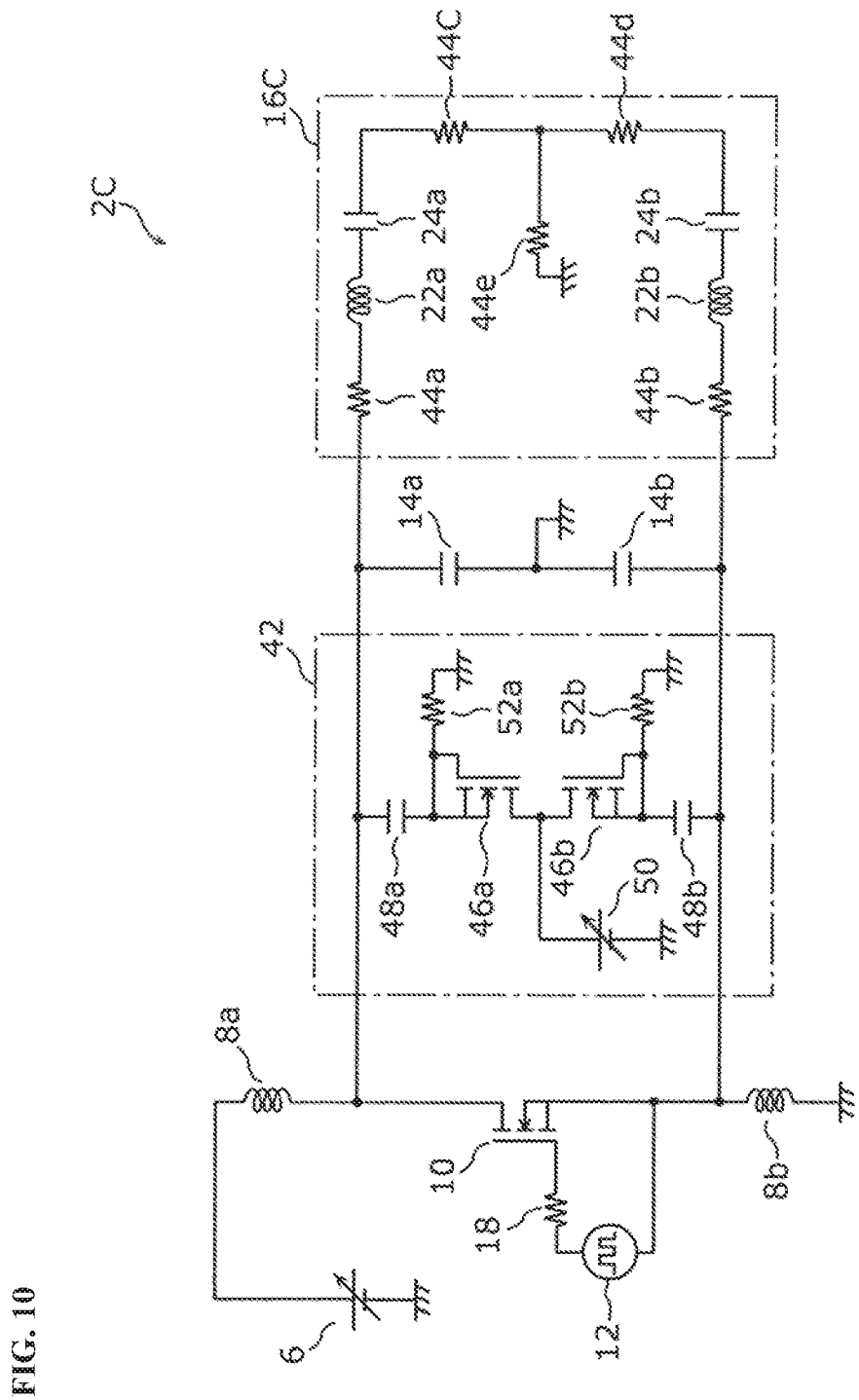
FIG. 10 is a circuit diagram illustrating the circuit configuration of the power source apparatus according to one or more embodiments of the present invention.

Next, the circuit configuration of a power source apparatus 2C according to one or more embodiments of the present invention will be described referring to FIG. 10. FIG. 10 is a circuit diagram illustrating the circuit configuration of the power source apparatus 2C according to one or more embodiments of the present invention.

As illustrated in FIG. 10, the power source apparatus 2C according to one or more embodiments of the present invention is provided with the DC power source 6, two choke coils 8a and 8b, the switching element 10, the driving unit 12, two shunt capacitors 14a and 14b, a resonance circuit 16C, and a compensating circuit 42 as its circuit configuration. Descriptions will be given below focusing on the differences from the power source apparatus 2 according to the aforementioned embodiments of the present invention.

The choke coil 8a is connected between the DC power source 6 and the drain terminal of the switching element 10. The choke coil 8b is connected between the source terminal of the switching element 10 and ground.

The switching element 10 has a relatively large rating to make the power supply of the power source apparatus 2C larger. Because of this, the switching element 10 has a relatively large parasitic capacitance Cds between the drain terminal and the source terminal.

The two shunt capacitors 14a and 14b are connected together in series, and are connected to the switching element 10 in parallel. The point of connection between the shunt capacitor 14a and the shunt capacitor 14b is connected to ground.

The resonance circuit 16C is a differential resonance circuit. The resonance circuit 16C has two series inductors 22a and 22b, two series capacitors 24a and 24b, and five resistors 44a, 44b, 44c, 44d, and 44e. The resistor 44a, series inductor 22a, series capacitor 24a, and resistor 44c are connected together in series in this order. Furthermore, the resistor 44b, series inductor 22b, series capacitor 24b, and resistor 44d are connected together in series in this order. The resistor 44e is connected between the point of connection between the resistor 44c and the resistor 44d, and ground.

The compensating circuit 42 is connected in parallel to the switching element 10. The compensating circuit 42 has a first switching element 46a, a second switching element 46b, a first DC (direct current) blocking capacitor 48a, a second DC blocking capacitor 48b, and a DC power source 50. The first DC blocking capacitor 48a, the first switching element 46a, the second switching element 46b, and the second DC blocking capacitor 48b are connected together in series in this order. Note that in this example, only one compensating circuit 42 was provided, but a plurality of compensating circuits 42 may be connected in parallel to the switching element 10.

Each of the first switching element 46a and the second switching element 46b are N-type MOSFETs having a gate terminal, a source terminal, and a drain terminal. Note that each of the first switching element 46a and the second switching element 46b may be, for example, a bipolar transistor or an IGBT or the like instead of a MOSFET.

Each drain terminal of the first switching element 46a and the second switching element 46b are connected together. By this, reverse voltage is suppressed from being applied to each of the first switching element 46a and the second switching element 46b.

The gate terminal and source terminal of the first switching switch 46a short to be the same potential. A first resistor 52a having a relatively high resistance value (for example, 100 kΩ) is connected between the gate terminal of the first switching element 46a and the ground. By this, the first switching element 46a can be suppressed from becoming ON, and current can be suppressed from flowing to the first switching element 46a.

In a similar manner, the gate terminal and source terminal of the second switching element 46b short to be the same potential. A second resistor 52b having a relatively high resistance value (for example, 100 kΩ) is connected between the gate terminal of the second switching element 46b and ground. By this, the second switching element 46b can be suppressed from becoming ON, and current can be suppressed from flowing to the first switching element 46b.

In other words, each of the first switching element 46a and the second switching element 46b are always in an OFF state because the gate terminal and source terminal have the same potential. Because of this, each of the first switching element 46a and the second switching element 46b function as if they were capacitors, and have parasitic capacitance between the drain terminal and the source terminal.

Note that DC voltage from the DC power source 6 and DC voltage from the DC power source 50 are both applied to each of the first switching element 46a and the second switching element 46b. Because of this, it is advantageous for the pressure resistance of each of the first switching element 46a and the second switching element 46b to be higher than the pressure resistance of the switching element 10.

The first DC blocking capacitor 48a is connected between the drain terminal of the switching element 10 and the source terminal of the first switching element 46a. The second DC blocking capacitor 48b is connected between the source terminal of the switching element 10 and the source terminal of the first switching element 46b. The first DC blocking capacitor 48a and the second DC blocking capacitor 48b suppresses DC current from the DC power source 50 from flowing into the switching element 10. Note that the capacitance of each of the first DC blocking capacitor 48a and the second DC blocking capacitor 48b are, for example, 1000 pF.

The DC power source 50 is a variable power source for generating DC power. The anode side of the DC power source 50 is connected to the drain terminal of each of the first switching element 46a and the second switching element 46b. The DC power source 50 applies, for example, a DC voltage of 10 to 100 V to each drain terminal. By changing the DC voltage applied to each drain terminal between, for example, 10 to 100 V, an entire capacitance Cp of the compensating circuit 42 changes along with each of the parasitic capacitance of each of the first switching element 46a and the second switching element 46b changing.

[4-2. Functional Configuration of the Power Source Apparatus]

Figure 11:
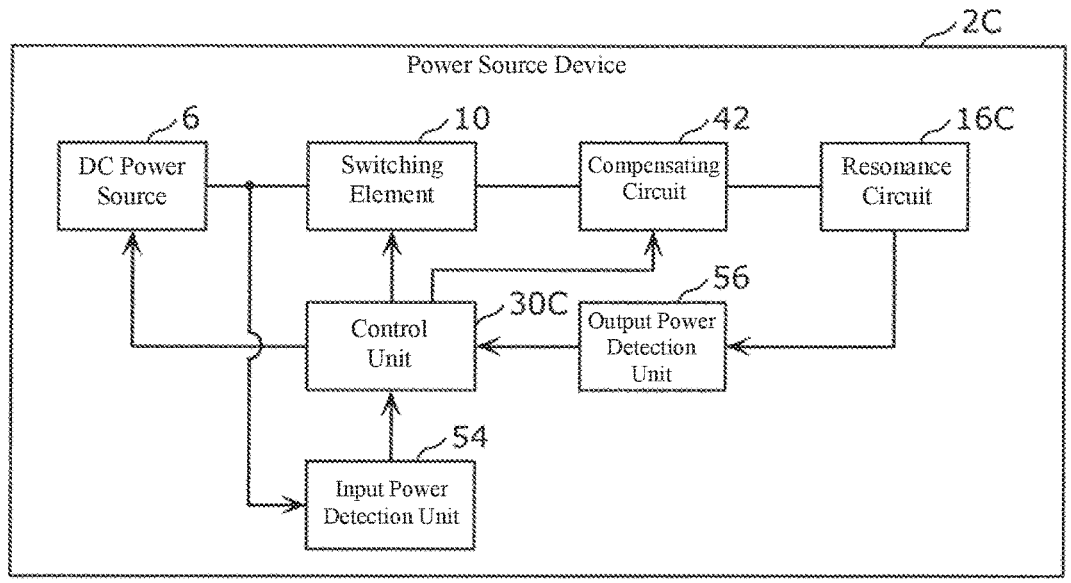
FIG. 11 is a block diagram illustrating the functional configuration of the power source apparatus according to one or more embodiments of the present invention.

Next, the functional configuration of the power source apparatus 2C according to one or more embodiments of the present invention will be described referring to FIG. 11. FIG. 11 is a block diagram illustrating the functional configuration of the power source apparatus 2C according to one or more embodiments of the present invention.

As illustrated in FIG. 11, the power source apparatus 2C is provided with an input power detection unit 54 and an output power detection unit 56 as a functional configuration.

The input power detection unit 54 detects input power Wi of the power source apparatus 2C. The output power detection unit 56 detects output power Wo of the power source apparatus 2C.

A control unit 30C calculates power efficiency (=Wo/Wi) based on the input power Wi and the output power Wo, and suppresses the DC voltage output from the DC power source 50 based on this power efficiency.

[4-3. Operation of the Power Source Apparatus]

Figure 12:
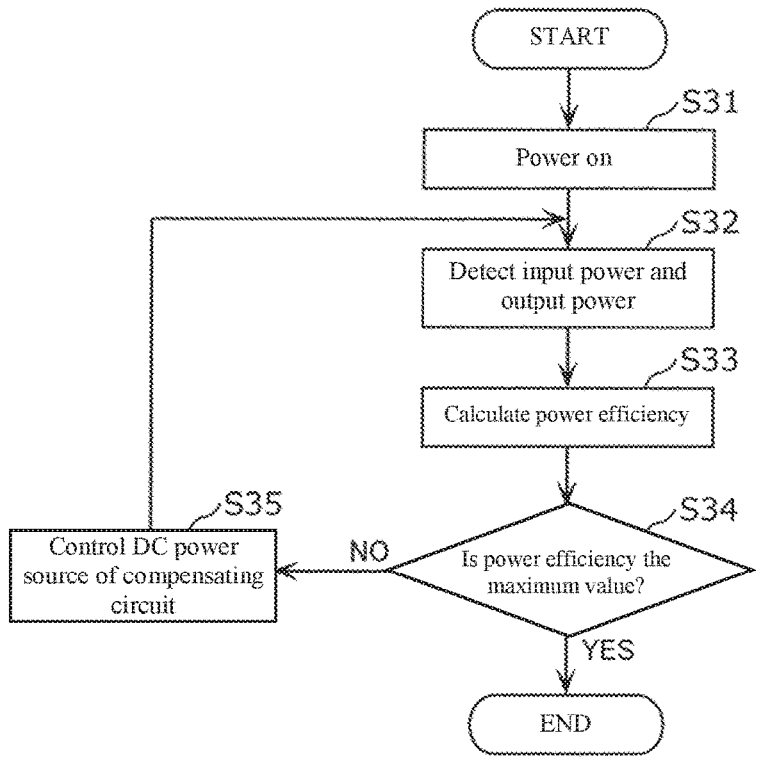
FIG. 12 is a flowchart illustrating the flow of operations of the power source apparatus according to one or more embodiments of the present invention.

Next, the operation of the power source apparatus 2C according to one or more embodiments of the present invention will be described referring to FIG. 12. FIG. 12 is a flowchart illustrating the flow of operations of the power source apparatus 2C according to one or more embodiments of the present invention.

As illustrated in FIG. 12, the power source apparatus 2C starts by the DC power source 6 being turned ON (S31). Afterward, the input power detection unit 54 detects the input power Wi and the output power detection unit 56 detects the output power Wo (S32).

Afterward, the control unit 30C calculates and determines power efficiency based on the input power Wi and the output power Wo (S33). When the power efficiency is less than the maximum value (Wo/Wi=1) (NO in S34), the control unit 30C carries out feedback control on the DC voltage output from the DC power source 50 so that the power efficiency becomes near the maximum value (S35).

[4-4. Effect]

Figure 13:
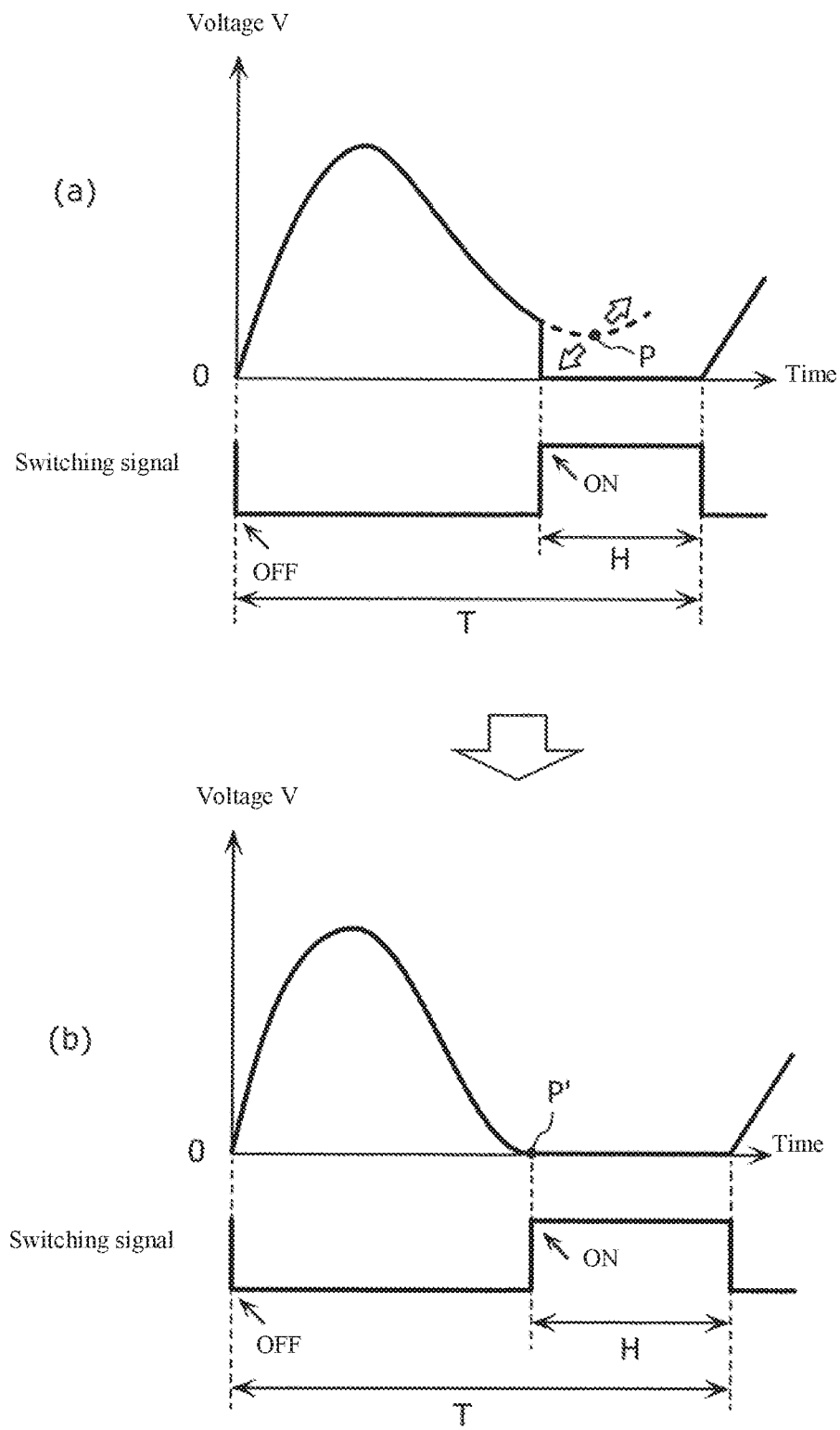
FIG. 13 is a graph showing the relationship between a voltage and a switching signal between terminals of the switching element in the power source apparatus according to one or more embodiments of the present invention.

Next, the effects obtained by the power source apparatus 2C according to one or more embodiments of the present invention will be described referring to FIG. 13. FIG. 13 is a graph showing the relationship between the voltage V between terminals of the switching element 10 and the switching signal in the power source apparatus 2C according to one or more embodiments of the present invention.

Generally, the parasitic capacitance Cds of the switching element 10 varies being effected by the DC voltage applied between terminals of the switching element 10, the temperature of the switching element 10 and the like. For example, when the DC voltage applied between terminals of the switching element 10 has changed from 10 V to 100 V, the parasitic capacitance Cds of the switching element 10 changes from 200 pF to 20 pF. By the parasitic capacitance Cds of the switching element 10 varying in this manner, the combined capacitance Co of the parasitic capacitance Cds of the switching element 10 and the entire capacitance Cp of the compensating circuit 42 varies from, for example, 83 pF to 9.8 pF. When the combined capacitance Co varies, as illustrated in (a) of FIG. 13, the minimum point P of the voltage V between terminals of the switching elements 10 changes, making it difficult to always operate the power source apparatus 2C at high efficiency.

One or more embodiments of the present invention are provided with the switching element 10 (one example of a switching portion), the driving unit 12 for turning the switching element 10 ON and OFF, and the compensating circuit 42 connected in parallel between terminals of the switching element 10. The compensating circuit 42 has a first switching element 46a (one example of a first switching portion), a second switching element 46b (one example of a second switching element) connected in series to the first switching element 46a, a first DC blocking capacitor 48a (one example of a first capacitor) connected in series to the first switching element 46a, connected between the switching element 10 and the first switching element 46a, a second DC blocking capacitor 48b (one example of a second capacitor) connected in series to the second switching element 46b, connected between the switching element 10 and the second switching element 46b, and a DC power source 50 (one example of a power source) applying DC voltage to each of the first switching element 46a and the second switching element 46b.

As described above, by carrying out feedback control of the DC voltage output from the DC power source 50 so that the power efficiency approaches the maximum value, as illustrated in (b) of FIG. 13, the minimum point of the voltage V between terminals of the switching element 10 moves from the minimum point P to the minimum point P'. At the minimum point P', at the timing when the switching element 10 switches from OFF to ON, the voltage V becomes 0 (zero) V, and the differentiation value dV of the voltage V becomes 0 (zero).

Furthermore, by carrying out feedback control of the DC voltage output from the DC power source 50 so that the power efficiency becomes substantially fixed at a maximum value, and the combined capacitance Co is maintained at a substantially fixed value. By this, the minimum point P' of the voltage V is substantially fixed without fluctuating.

As a result, switching loss can be sufficiently suppressed to be small, and efficiency of the power source apparatus 2C can be sufficiently improved.

[5-1. Functional Composition of the Power Source Apparatus]

Figure 14:
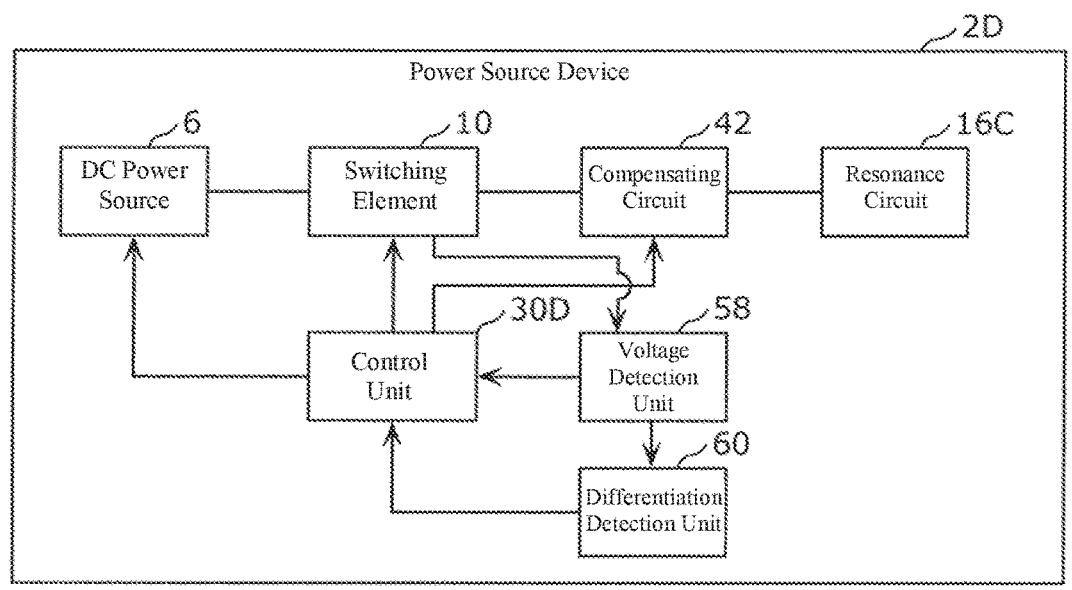
FIG. 14 is a block diagram illustrating the functional configuration of the power source apparatus according to one or more embodiments of the present invention.

Next, the functional configuration of a power source apparatus 2D according to one or more embodiments of the present invention will be described referring to FIG. 14. FIG. 14 is a block diagram illustrating the functional configuration of the power source apparatus 2D according to one or more embodiments of the present invention.

Note that the circuit configuration of the power source apparatus 2D is the same as the aforementioned embodiments of the present invention, and descriptions thereof will be omitted. Below, the reference numerals in FIG. 10 should be appropriately referenced in regards to the reference numerals relating to the circuit configuration of the power source apparatus 2D.

As illustrated in FIG. 14, the power source apparatus 2D according to one or more embodiments of the present invention is provided with a voltage detection unit 58 and a differentiation detection unit 60 as a functional configuration.

The voltage detection unit 58 detects voltage between terminals of the switching element 10, or more specifically, the voltage between the drain terminal and the source terminal.

The differentiation detection unit 60 detects a differentiation value of the voltage, based on the voltage detected by the voltage detection unit 58.

The control unit 30D controls the DC voltage output from the DC power source 50 based on the voltage detected by the voltage detection unit 58 and the differentiation value detected by the differentiation detection unit 60.

[5-2. Operation of the Power Source Apparatus]

Figure 15:
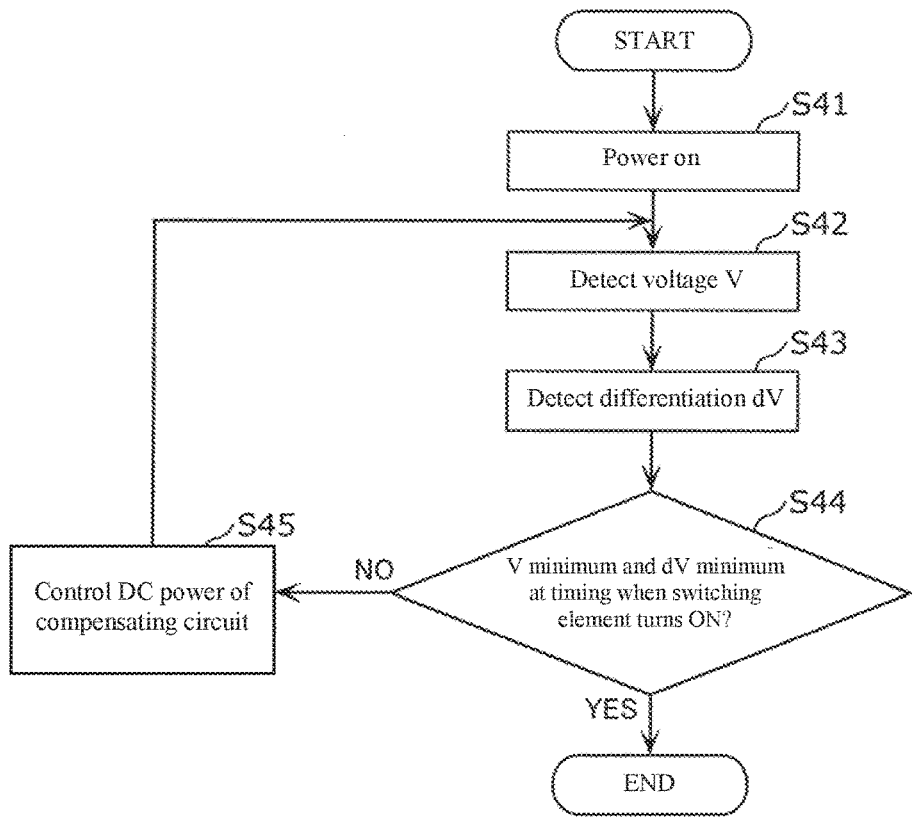
FIG. 15 is a flowchart illustrating the flow of operations of the power source apparatus according to one or more embodiments of the present invention.

Next, the operation of the power source apparatus 2D according to one or more embodiments of the present invention will be described referring to FIG. 15. FIG. 15 is a flowchart illustrating the flow of operations of the power source apparatus 2D according to one or more embodiments of the present invention.

As illustrated in FIG. 15, the power source apparatus 2D starts by the DC power source 6 being turned ON (S41). The voltage detection unit 58 detects the voltage V between terminals of the switching element 10 (S42). Afterward, the differentiation detection unit 60 detects the differentiation value dV of the voltage V based on the voltage V detected by the voltage detection unit 58 (S43).

Afterward, the control unit 30D determines whether the voltage V is at the minimum value (for example, 0 (zero) V) and whether the differentiation value dV is at the minimum value (for example, 0 (zero)), at the timing when the switching element 10 switches from OFF to ON (S44). When the voltage V is not at the minimum value, or the differentiation value dV is not at the minimum value (NO in S44), the control unit 30D carries out feedback control on the DC voltage output from the DC power source 50 so that the voltage V approaches the minimum value and the differentiation value dV approaches the minimum value (S45).

[5-3. Effects]

As described above, by carrying out feedback control on the DC voltage output from the DC power source 50 so that the voltage V approaches the minimum value and the differentiation value dV approaches the minimum value, the combined capacitance Co is maintained at a substantially fixed value. By this, the minimum point of the voltage V moves from the minimum point to the minimum point P' (see FIG. 13), and is then substantially fixed at the minimum point P' without fluctuating.

As a result, switching loss can be sufficiently suppressed to be small, and efficiency of the power source apparatus 2D can be sufficiently improved.

[6-1. Functional Configuration of the Power Source Apparatus]

Figure 16:
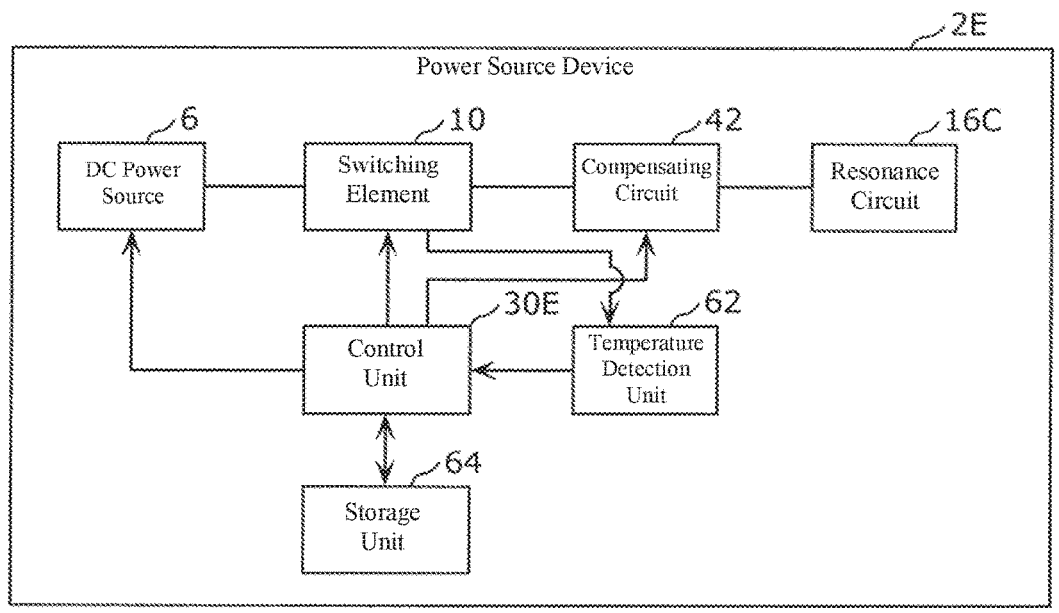
FIG. 16 is block diagram illustrating the functional configuration of the power source apparatus according to one or more embodiments of the present invention.

Next, the functional configuration of the power source apparatus 2E according to one or more embodiments of the present invention will be described referring to FIG. 16. FIG. 16 is block diagram illustrating the functional configuration of the power source apparatus 2E according to one or more embodiments of the present invention.

Note that the circuit configuration of the power source apparatus 2E is the same as the aforementioned embodiments of the present invention, and descriptions thereof will be omitted. Below, the reference numerals in FIG. 10 should be appropriately referenced in regards to the reference numerals relating to the circuit configuration of the power source apparatus 2E.

As illustrated in FIG. 16, the power source apparatus 2E according to one or more embodiments of the present invention is provided with a temperature detection unit 62 and a storage unit 64 as a functional configuration.

The temperature detection unit 62 detects the temperature of the switching element 10 at, for example, a prescribed frequency. The temperature detection unit 62 is, for example, a thermistor or the like.

The storage unit 64 stores a voltage table and a temperature table. Voltage data relating to a combination of a DC voltage V1 of the DC power source 6 and a voltage V2 of the DC power source 50 (V1, V2) so that makes the combined capacitance Co becomes substantially fixed, is stored in the voltage table. Temperature data relating to a combination of a temperature T of the switching element 10 and the voltage V2 of the DC power source 50 (T, V2) so that makes the combined capacitance Co becomes substantially fixed, is stored in the temperature table.

The control unit 30E controls the DC voltage output from the DC power source 50 based on the voltage table and temperature table stored in the storage unit 64.

[6-2. Operation of the Power Source Apparatus]

Figure 17:
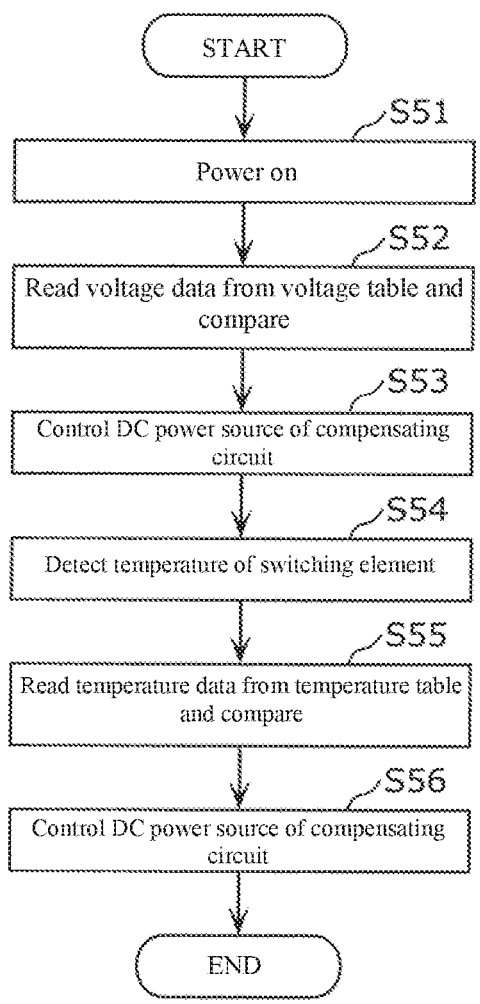
FIG. 17 is a flowchart illustrating the flow of operations of the power source apparatus according to one or more embodiments of the present invention.

Next, the operation of the power source apparatus 2E according to one or more embodiments of the present invention will be described referring to FIG. 17. FIG. 17 is a flowchart illustrating the flow of operations of the power source apparatus 2E according to one or more embodiments of the present invention.

As illustrated in FIG. 17, the power source apparatus 2E starts by the DC power source 6 being turned ON (S51).

Afterward, the control unit 30E reads voltage data from the voltage table stored in the storage unit 64, and compares voltage data with the DC voltage of the DC power source 6 and the DC voltage of the DC power source 50 at the present time (S52). After this, the control unit 30E controls the DC voltage of the DC power source 50 based on this comparison (S53).

For example, when the DC voltage V1 of the DC power source 6 at the present time is 20V and the DC voltage V2 of the DC power source 50 is 90 V, the control unit 30E refers to a combination corresponding to DC voltage V1 of the DC power source 6 at the present time V1=20 V (V1, V2)=(20 V, 100 V) from the read voltage data. In this case, because there is a difference between the DC voltage V2 of the DC power source 50 at the present time=90 V and the combination referred to from the voltage data (V1, V2)=(20 V, 100 V), the DC voltage V2 of the DC power source 50 is controlled from 90 V to 100 V.

After this, the temperature detection unit 62 detects the temperature of the switching element 10 (S54). Afterward, the control unit 30E reads temperature data from the temperature table stored in the storage unit 64, and compares this temperature data with the temperature of the switching element 10 and the DC voltage of the DC power source 50 at the present time (S55). After this, the control unit 30E controls the DC voltage of the DC power source 50 based on this comparison (S56).

For example, when the temperature T of the switching element 10 at the present time is 80° C. and the DC voltage V2 of the DC power source 50 is 80 V, the control unit 30E refers to a combination of the temperature T of the switching element 10 at the present time=80° C. (T, V2)=(80° C., 90 V) from the read voltage data. In this case, because there is a difference between the DC voltage V2 of the DC power source 50 at the present time=80 V and the combination referred to from the voltage data (T, V2)=(80 V, 90 V), the DC voltage V2 of the DC power source 50 is controlled from 80 V to 90 V.

[6-3. Effects]

As described above, the control unit 30E controls the DC voltage output from the DC power source 50 based on the voltage table and temperature table stored in the storage unit 64. By this, the DC voltage of the DC power source 50 can be controlled to a voltage wherein the combined capacitance Co is substantially fixed.

As a result, switching loss can be sufficiently suppressed to be small, and efficiency of the power source apparatus 2E can be sufficiently improved.

Note that the control unit 30E controls the DC voltage output from the DC power source 50 based on the voltage table and the temperature table, but it may control the DC voltage output from the DC power source 50 based on a prescribed formula that makes the combined capacitance Co a substantially fixed value.

Furthermore, the control unit 30E controls the DC voltage of the DC power source 50 each time the temperature of the switching element 10 is detected, but may control the DC voltage of the DC power source 50 at a timing when the amount of change in temperature of the switching element 10 exceeds a threshold value.

Furthermore, in the flowchart of FIG. 17, steps S54 to S56 described above may be omitted.

[7-1. Circuit Configuration of the Power Source Apparatus]

Figure 18:
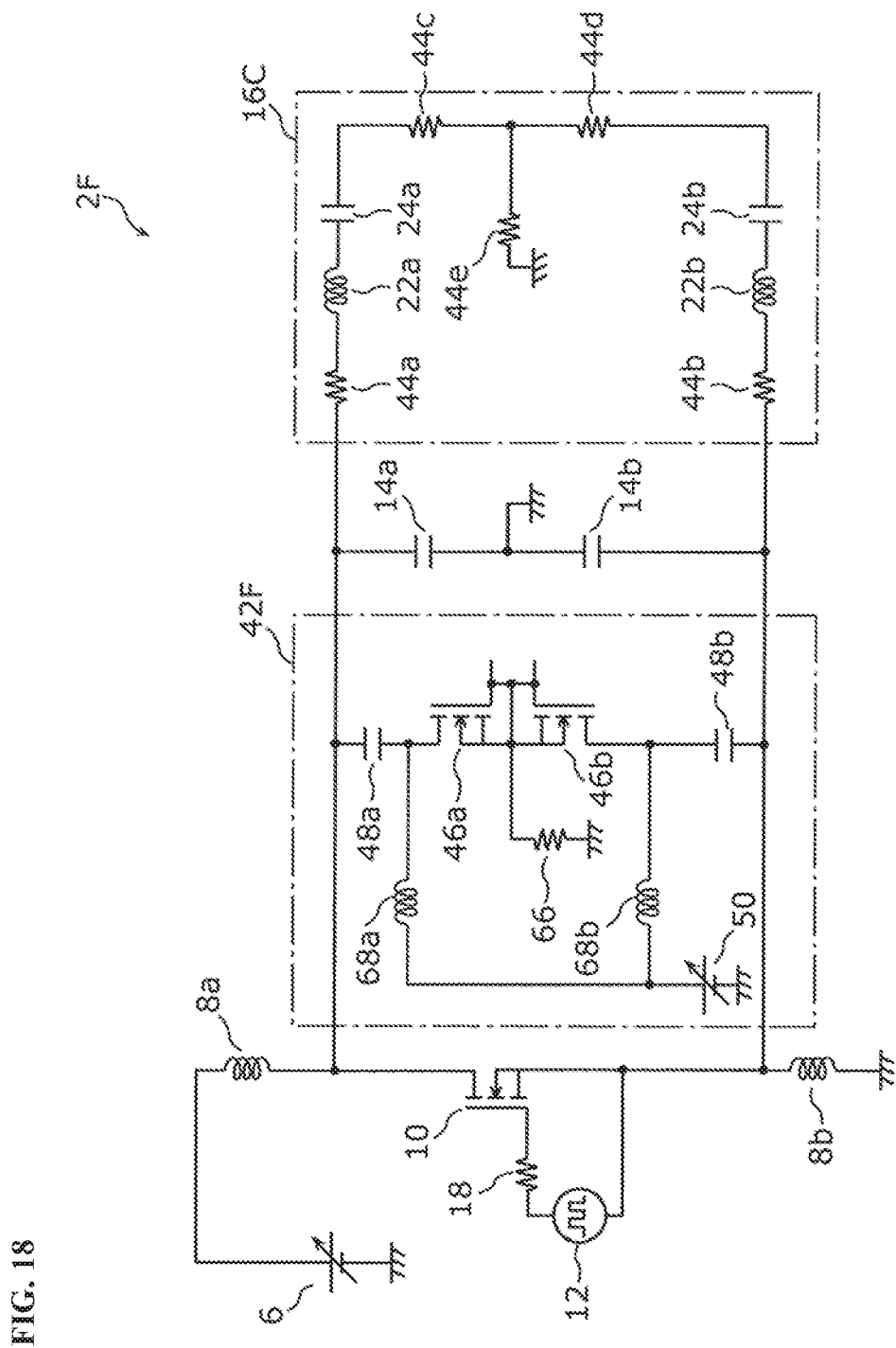
FIG. 18 is a circuit diagram illustrating the circuit configuration of the power source apparatus according to one or more embodiments of the present invention.

Next, the circuit configuration of a power source apparatus 2F according to one or more embodiments of the present invention will be described referring to FIG. 18. FIG. 18 is a circuit diagram illustrating the circuit configuration of the power source apparatus 2F according to one or more embodiments of the present invention.

As illustrated in FIG. 18, in the power source apparatus 2F according to one or more embodiments of the present invention, the circuit configuration of a compensating circuit 42F differs from the aforementioned embodiments of the present invention.

Specifically, each source terminal of the first switching element 46a and the second switching element 46b are connected together. The gate terminal and source terminal of the first switching switch 46a short to be the same potential. In a similar manner, the gate terminal and source terminal of the second switching element 46b short to be the same potential. A resistor 66 having a relatively high resistance value (for example, 100 kΩ) is connected between each gate terminal of the first switching element 46a and the second switching element 46b, and ground.

A first AC (alternating current) blocking coil 68a is connected between the DC power source 50 and the drain terminal of the first switching element 46a. Furthermore, a second AC blocking coil 68b is connected between the DC power source 50 and the drain terminal of the second switching element 46b. The first AC blocking coil 68a and the second AC blocking coil 68b suppress AC current from flowing into the DC power source 50. Note that the inductance of each of the first AC blocking coil 68a and the second Ac blocking coil 68b are, for example, 23 µH. Note that instead of the first AC blocking coil 68a and the second AC blocking coil 68b, a first resistor and a second resistor having a relatively high resistance value (for example, 100 kΩ) may be connected.

[7-2. Effects]

Switching loss can be sufficiently suppressed to be small, and efficiency of the power source apparatus 2F can be sufficiently improved in a similar manner as the aforementioned embodiments described above.

[8-1. Circuit Configuration of the Power Source Apparatus]

Figure 19:
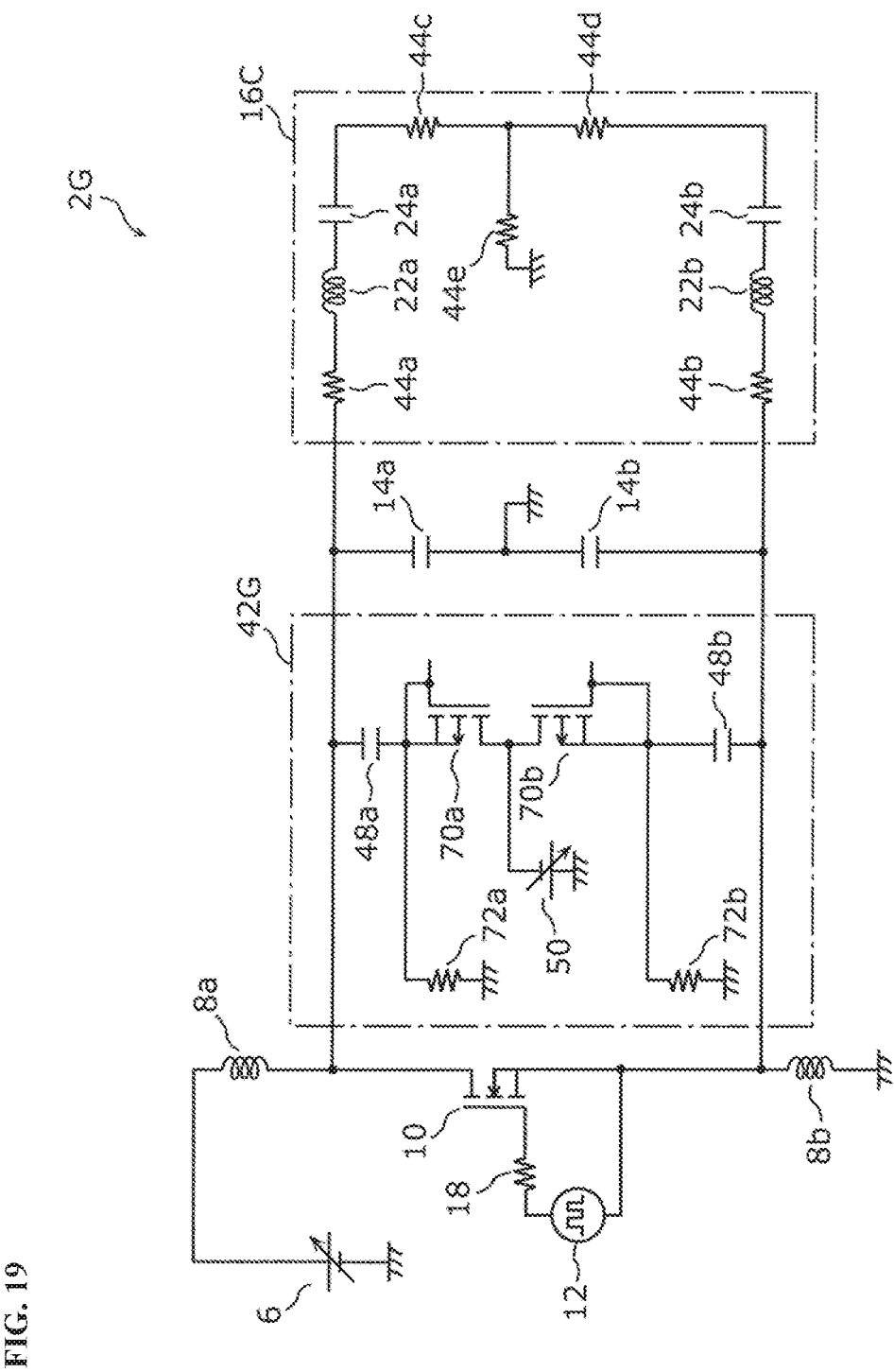
FIG. 19 is a circuit diagram illustrating the circuit configuration of the power source apparatus according to one or more embodiments of the present invention.

Next, the circuit configuration of a power source apparatus 2G according to one or more embodiments of the present invention will be described referring to FIG. 19. FIG. 19 is a circuit diagram illustrating the circuit configuration of the power source apparatus 2G according to one or more embodiments of the present invention.

As illustrated in FIG. 19, in the power source apparatus 2G according to one or more embodiments of the present invention, the circuit configuration of a compensating circuit 42G differs from the aforementioned embodiments of the present invention.

Specifically, each of a first switching element 70a and a second switching element 70b are P-type MOSFETs. Each drain terminal of the first switching element 70a and the second switching element 70b are connected together.

The gate terminal and source terminal of the first switching switch 70a short to be the same potential. A first resistor 72a having a relatively high resistance value (for example, 100 kΩ) is connected between the gate terminal of the first switching element 70a and ground.

In a similar manner, the gate terminal and source terminal of the second switching element 70b short to be the same potential. A second resistor 72b a having a relatively high resistance value (for example, 100 kΩ) is connected between the gate terminal of the second switching element 70b and ground.

Furthermore, the orientation of the DC power source 50 is opposite to what it is in the aforementioned embodiments of the present invention. That is, the cathode side of the DC power source 50 is connected to the drain terminal of each of the first switching element 70a and the second switching element 70b. Because this is opposite to the orientation of the parasitic diode in P-type MOSFETs and N-type MOSFETS, it is made so that DC current does not flow to each of the first switching element 70a and the second switching element 70b when the DC voltage is output from the DC power source 50.

[8-2. Effects]

In one or more embodiments of the present invention, switching loss can be sufficiently suppressed to be small, and efficiency of the power source apparatus 2G can be sufficiently improved in a similar manner as the aforementioned embodiments of the present invention described above.

In one or more embodiments of the present invention, the drain terminal of each of the first switching element 70a and the second switching element 70b are connected together, but the source terminal of each of the first switching element 70a and the second switching element 70b may be connected.

[9-1. Circuit Configuration of the Power Source Apparatus]

Figure 20:
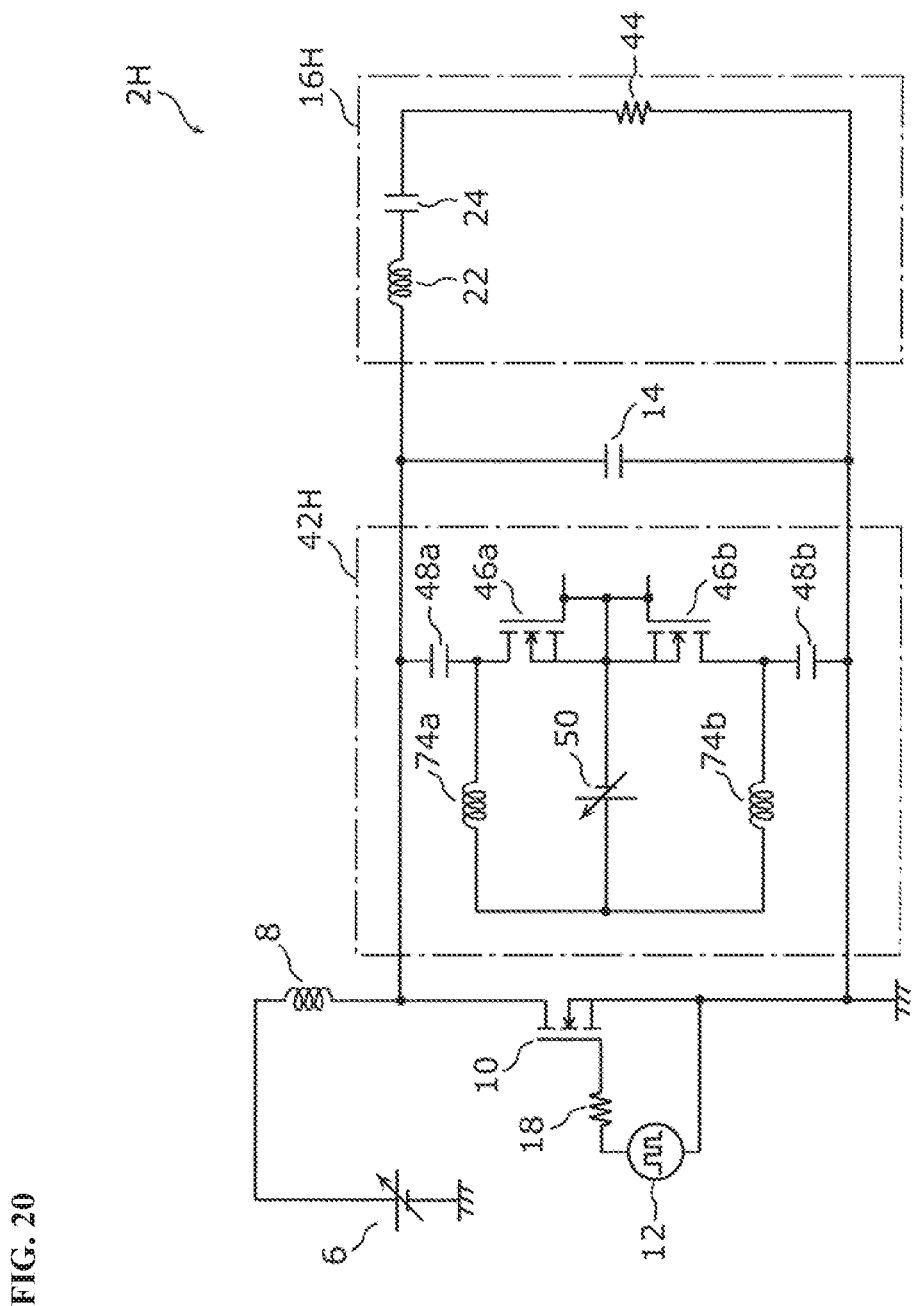
FIG. 20 is a circuit diagram illustrating the circuit configuration of the power source apparatus according to one or more embodiments of the present invention.

Next, the circuit configuration of a power source apparatus 2H according to one or more embodiments of the present invention will be described referring to FIG. 20. FIG. 20 is a circuit diagram illustrating the circuit configuration of the power source apparatus 2H according to one or more embodiments of the present invention.

As illustrated in FIG. 20, in the power source apparatus 2H according to one or more embodiments of the present invention, the circuit configuration of each of a compensating circuit 42H and a resonance circuit 16H are different from the aforementioned embodiments of the present invention.

Specifically, each of the first switching element 46a and the second switching element 46b are N-type MOSFETs. Each source terminal of the first switching element 46a and the second switching element 46b are connected together.

The gate terminal and source terminal of the first switching switch 46a short to be the same potential. In a similar manner, the gate terminal and source terminal of the second switching element 46b short to be the same potential.

The orientation of the DC power source 50 is opposite to what it is in the aforementioned embodiments of the present invention. In other words, the cathode side of the DC power source 50 is connected to the source terminal of each of the first switching element 46a and the second switching element 46b.

A first AC blocking coil 74a is connected between the anode side of the DC power source 50 and the drain terminal of the first switching element 46a. Furthermore, a second AC blocking coil 74b is connected between the anode side of the DC power source 50 and the drain terminal of the second switching element 46b.

The resonance circuit 16H is a single-type resonance circuit. The resonance circuit 16H has the series inductor 22, the series capacitor 24, and the resistor 44. The series inductor 22, the series capacitor 24, and the resistor 44 are connected together in series in this order.

[9-2. Effects]

In one or more embodiments of the present invention, switching loss can be sufficiently suppressed to be small, and efficiency of the power source apparatus 2H can be sufficiently improved in a similar manner as the aforementioned embodiments described above.

Additionally, by making the resonance circuit 16H a single-type, the power source apparatus 2H can be made smaller compared to when making the resonance circuit a differential-type.

(Variation)

The power feeding devices according to embodiments of the present invention were described above, but the present invention is not limited to the above embodiments. For example, each of the embodiments described above may be combined with each other.

The power source apparatus according to one or more embodiments of the present invention may be applied as, for example, a class E amplifier mounted in a non-contact power source apparatus or the like.

DESCRIPTION OF THE REFERENCE NUMERALS

| | |
|---|---|
| 2, 2A, 2A', 2B, 2C, 2D, 2E, 2F, 2G, 2H | Power source apparatus |
| 4 | Load |
| 6, 50 | DC power source |
| 8, 8a, 8b | Choke coil |
| 10 | Switching element (Switch) |
| 12 | Drive unit |
| 14, 14a, 14Aa, 14b, 14Ab | Shunt capacitor |
| 14A | Shunt capacitor group |
| 16, 16A, 16A', 16C, 16H | Resonance circuit |
| 18 | Gate resistor |
| 20 | Output terminal |
| 22, 22a, 22Aa, 22b, 22Ab | Series inductor |
| 22A | Series inductor group |
| 24, 24a, 24Aa, 24b, 24Ab | Series capacitor |
| 24A | Series capacitor group |
| 26, 58 | Voltage detection unit |
| 28, 60 | Differentiation detection unit |
| 30, 30A, 30A', 30B, 30C, 30D, 30E | Control unit (Controller) |
| 32 | First switching switch |
| 34 | Second switching switch |
| 36 | Third switching switch |
| 38, 54 | Input power detection unit |
| 40, 56 | Output power detection unit |
| 42, 42F, 42G, 42H | Compensating circuit |
| 44, 44a, 44b, 44c, 44d, 44e, 66 | Resistor |
| 46a, 70a | First switching element |
| 46b, 70b | Second switching element |
| 48a | First DC blocking capacitor |
| 48b | Second DC blocking capacitor |
| 52a, 72a | First resistor |
| 52b, 72b | Second resistor |
| 62 | Temperature detection unit |
| 64 | Storage unit |
| 68a, 74a | First AC blocking coil |
| 68b, 74b | Second AC blocking coil |

What is claimed is:

1. A power source apparatus for supplying power to a load, comprising:
    a switch;
    a controller that:
      detects a voltage applied to the switch,
      switches a state of the switch from OFF to ON when the voltage is equal to or smaller than a predetermined threshold value;
    a first DC power source that applies DC voltage between terminals of the switch; and
    a compensating circuit that is connected in parallel to the switch and that comprises a second DC power source and a capacitor,
    wherein the controller controls a combined capacitance of parasitic capacitances of the switch and the compensating circuit to be constant by changing a voltage of the second DC power source.

2. The power source apparatus according to claim 1, wherein the controller switches the state of the switch from OFF to ON by adjusting a duty ratio of the switch.

3. The power source apparatus according to claim 2, wherein the controller:
    detects a differentiation value of the voltage based on the voltage, and
    controls the duty ratio of the switch based on the differentiation value.

4. The power source apparatus according to claim 3, wherein the controller:
    increases the duty ratio of the switch when the differentiation value is a positive value and when the state of the switch is switched from OFF to ON, and
    decreases the duty ratio of the switch when the differentiation value is a negative value and when the state of the switch is switched from OFF to ON.

5. The power source apparatus according to claim 2, wherein the controller:
    detects input and output power of the power source apparatus,
    determines power efficiency based on the input and the output power, and
    controls the duty ratio based on the power efficiency.

6. The power source apparatus according to claim 5, wherein the controller controls the duty radio so that the power efficiency is maximized.

7. The power source apparatus according to claim 1, wherein the predetermined threshold value is 10% or less than a maximum value of voltage applied between terminals of switching elements of the switch.

8. The power source apparatus according to claim 1, further comprising:
    a plurality of first capacitors connected between the switch and ground,
    wherein the controller controls a timing of when the voltage becomes a local minimum or controls the local minimum of the voltage by switching a connection of the plurality of first capacitors.

9. The power source apparatus according to claim 8, further comprising:
    a plurality of second capacitors connected between the switch and the load,
    wherein the controller adjusts the timing of when the voltage becomes the local minimum or adjusts the local minimum of the voltage by switching at least one of the connection of the plurality of first capacitors and a connection of the plurality of second capacitors.

10. The power source apparatus according to claim 9, further comprising:
    a plurality of inductors connected between the switch and the load,
    wherein the controller controls the timing of when the voltage becomes the local minimum or controls the local minimum of the voltage by switching at least one of the connection of the plurality of first capacitors, the connection of the plurality of second capacitors, and the connection of the plurality of inductors.

11. The power source apparatus according to claim 8, wherein the controller switches the connection of the plurality of first capacitors based on the duty ratio of the switch.

12. The power source apparatus according to claim 1, further comprising:
    a choke coil that is connected between the first DC power source and one of the terminals of the switch, wherein the choke coil makes DC current from the first DC power source constant.

13. The power source apparatus according to claim 1, further comprising:
a thermistor that detects a temperature of the switch; and
a memory that stores a first table that associates the temperature with the voltage of the second DC power source,
wherein the controller controls the voltage of the second DC power source based on the first table so that the combined capacitance becomes constant.

14. The power source apparatus according to claim 13, wherein the memory stores a second table that associates voltages of the first and the second DC power source, and
wherein the controller controls the voltage of the second DC power based on the first and the second table so that the combined capacitance becomes constant.

* * * * *